US009424953B2

(12) United States Patent
Hirano

(10) Patent No.: US 9,424,953 B2
(45) Date of Patent: *Aug. 23, 2016

(54) SEMICONDUCTOR MEMORY DEVICE INCLUDING REPAIR CIRCUIT

(71) Applicant: Makoto Hirano, Seongnam-si (KR)

(72) Inventor: Makoto Hirano, Seongnam-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 132 days.

This patent is subject to a terminal disclaimer.

(21) Appl. No.: 14/310,405

(22) Filed: Jun. 20, 2014

(65) Prior Publication Data

US 2014/0380117 A1   Dec. 25, 2014

(30) Foreign Application Priority Data

Jun. 20, 2013  (JP) .................................. 2013-129547
May 23, 2014  (KR) ........................ 10-2014-0062359

(51) Int. Cl.
*G11C 29/00* (2006.01)
*G06F 11/16* (2006.01)
*G11C 16/26* (2006.01)

(52) U.S. Cl.
CPC ........... *G11C 29/78* (2013.01); *G06F 11/1666* (2013.01); *G11C 29/702* (2013.01); *G11C 16/26* (2013.01)

(58) Field of Classification Search
CPC ..... G11C 29/78; G11C 29/702; G11C 16/26; G11C 29/52; G11C 29/44; G06F 11/1666; G06F 11/1068; G06F 11/076
USPC ........................................................ 714/710
See application file for complete search history.

(56) References Cited

U.S. PATENT DOCUMENTS

| | | | |
|---|---|---|---|
| 6,563,732 B2 | 5/2003 | Matarrese et al. | |
| 7,032,142 B2 | 4/2006 | Fujioka et al. | |
| 8,286,055 B2* | 10/2012 | Rho | .................... G06F 11/1048 365/230.08 |
| 8,355,289 B2* | 1/2013 | Kajigaya | .................. G11C 8/08 365/189.09 |
| 8,375,273 B2 | 2/2013 | Hara | |

(Continued)

FOREIGN PATENT DOCUMENTS

| | | |
|---|---|---|
| EP | 1282138 A1 | 2/2003 |
| EP | 1315176 A2 | 5/2003 |

(Continued)

OTHER PUBLICATIONS

Tanakamaru, S.; Doi, M.; Takeuchi, K., "Unified solid-state-storage architecture with NAND flash memory and ReRAM that tolerates 32× higher BER for big-data applications," in Solid-State Circuits Conference Digest of Technical Papers (ISSCC), 2013 IEEE International , vol., No., pp. 226-227, Feb. 17-21, 2013.*

(Continued)

*Primary Examiner* — Cynthia Britt
(74) *Attorney, Agent, or Firm* — Muir Patent Law, PLLC

(57) ABSTRACT

A data transfer unit includes a page buffer to latch data of a normal bit line connected to a normal memory cell, a second page buffer to latch data of a parity bit line connected to a parity memory cell, and a third page buffer that is first replaced when the first page buffer is defective or when the second page buffer is defective. ECC Bus_1 is connected to the first, second, and third page buffers, respectively, and Data Bus_1 is connected to the first and third page buffers.

20 Claims, 24 Drawing Sheets

(56) References Cited

U.S. PATENT DOCUMENTS

| | | | |
|---|---|---|---|
| 2003/0026129 A1 | 2/2003 | Matarrese et al. | |
| 2007/0255981 A1 | 11/2007 | Eto | |
| 2011/0231724 A1* | 9/2011 | Hara | G06F 11/1068 714/746 |
| 2014/0169092 A1* | 6/2014 | Miyamoto | G11C 16/26 365/185.09 |
| 2014/0380116 A1* | 12/2014 | Hirano | G11C 29/78 714/758 |

FOREIGN PATENT DOCUMENTS

| | | |
|---|---|---|
| EP | 1837881 A1 | 9/2007 |
| JP | 8-31196 | 2/1996 |
| JP | 11-242899 | 9/1999 |
| JP | 2007-257791 A | 10/2007 |
| JP | 2011-197819 A | 10/2011 |

OTHER PUBLICATIONS

Cernea et al. "A 34 MB/s MLC Write Throughput 16 Gb NAND With All Bit Line Architecture on 56 nm Technology," in Solid-State Circuits, IEEE Journal of , vol. 44, No. 1, pp. 186-194, Jan. 2009.*

Han-Lin Li; Chia-Lin Yang; Hung-Wei Tseng, "Energy-Aware Flash Memory Management in Virtual Memory System," in Very Large Scale Integration (VLSI) Systems, IEEE Transactions on , vol. 16, No. 8, pp. 952-964, Aug. 2008.*

Pathak, S.; Tay, Y.C.; Qingsong Wei, "Power and endurance aware Flash-PCM memory system," in Green Computing Conference and Workshops (IGCC), 2011 International , vol., No., pp. 1-6, Jul. 25-28, 2011.*

* cited by examiner

US 9,424,953 B2

SEMICONDUCTOR MEMORY DEVICE INCLUDING REPAIR CIRCUIT

CROSS-REFERENCE TO RELATED APPLICATIONS

A claim for priority under 35 U.S.C. §119 is made to JP Application No. 2013-129547 filed Jun. 20, 2013 in the Japanese Patent Office, and to KR Application No. 2014-0062359 filed May 23, 2014 in the Korean Intellectual Property Office, the entire contents of which are hereby incorporated by reference.

BACKGROUND

1. Field

The present general inventive concepts described herein relate to a semiconductor memory device.

2. Description of the Related Art

In a conventional flash memory, a tunnel oxide layer deteriorates due to a plurality of write operations. Deterioration of the tunnel oxide layer causes a loss of a storage characteristic of a memory element (memory cell transistor) while data is stored therein, thereby increasing an error rate: a rate in which error bits are generated. In particular, in a NAND flash memory, the error rate may increase with an increase in a capacity of a memory cell, that is, scaling of a fabricating process. For this reason, at a write operation, redundancy data (parity data) of an error correcting code (ECC) (hereinafter, referred to as ECC redundancy data) is added to data to be stored, and resultant data is stored in a flash memory as a data stream. At a read operation, data that includes an error bit(s) is corrected using the ECC redundancy data. For example, a semiconductor memory device including an ECC circuit to perform ECC processing is disclosed in a patent reference 1 (Japanese Patent H11-242899).

Also, in the NAND flash memory, a test operation is performed just after fabrication to detect various cases: a bit fault that makes it impossible to store data, a short circuit that a bit line connected to a memory cell transistor is connected with another bit line, and a bit line open phenomenon. In these cases, data of a memory cell transistor is latched via a bit line, amplified, and output to an external device, or a set of a page buffer to write data at a memory cell, a bit line connected to the page buffer, and a memory cell transistor connected to the bit line is replaced with a defect-free set. To replace a defective set with a defect-free set is referred to as a redundancy technique. However, in the semiconductor memory device disclosed in the patent reference 1, a defective bit is repaired using ECC processing without replacing a defect using the redundancy technique. In this manner, however, a correction processing capacity of ECC processing to repair a memory cell transistor with no data storage characteristic due to its inherent aging is consumed to repair a defective bit due to a fabrication process, thereby lowering the correction processing capacity of ECC processing.

For the above-described reason, today, repairing a defective bit and correcting an error using ECC processing are made independently as will be described later.

FIG. 14 is a diagram schematically illustrating a typical block configuration of a NAND flash memory. In a NAND flash memory 80 illustrated in FIG. 14, a NAND controller (memory controller) 90 disposed outside of the NAND flash memory 80 executes ECC processing.

The NAND flash memory 80 in FIG. 14 contains a memory array 101, a page buffer 82, a column coding circuit 83, a column repair multiplexer (hereinafter, referred to as a column repair circuit) 84, and an I/O PAD 106.

Also, the NAND controller 90 has an ECC engine (ECC circuit) 87 and an I/O PAD 106c.

The memory array 101 includes a plurality of memory cell transistors, each of which stores 1-bit data. In the memory array 101, memory cell transistors connected to the same word line constitute a page. Data is written at or read from memory cell transistors in a page at the same time.

The page buffer 82 is configured to store data bits the number of which is equal to the number of memory cell transistors in a page of the memory cell array 101. FIG. 15 is a diagram illustrating a page buffer unit of a page buffer 82. Also, FIG. 16 is a diagram illustrating an internal circuit configuration of a conventional page buffer unit.

The page buffer 82 consists of a plurality of page buffer units, each of which is configured as illustrated in FIG. 15. The page buffer unit includes bit circuits 51_0a to 51_7a, each of which is connected to one bit line and stores data read from a memory cell via a bit line or data to be written at a memory cell via the bit line.

When receiving a column address signal Sub BL Coding from a column coding circuit 83 illustrated in FIG. 14, a multiplexer 52_b selects one of the bit circuits 51_0a to 51_7a based on a column address signal (DIO<i> in FIG. 16). That is, the multiplexer 52_b connects one of eight bit lines to a PB control circuit 83_1.

Receiving a column address signal Coding from the column coding circuit 83 illustrated in FIG. 14, the PB control circuit 83_1 connects a bit circuit selected by the multiplexer 52_b to a peripheral circuit via a data bus Data Bus_1.

With the above-described configuration, each memory cell transistor in a page is connected to a bit line of the page buffer 82 via a bit line. One, selected by a column address, from among the bit lines is connected to a data bus, so data is written at or read from a memory cell.

Returning to FIG. 14, the column coding circuit 83 generates the column address signals Sub BL Coding and Coding (refer to FIG. 15) based on a column address from an address control circuit (not illustrated) and selects a page buffer unit of the page buffer 82 corresponding to the column address signal. Accordingly, data is written at a memory cell transistor via the I/O pad 106, data buses Data Bus_2 and Data Bus_1, a bit circuit, and a bit line. Also, data is read from a memory cell via a bit line, a bit line, the data buses Data Bus_2 and Data Bus_1, and the I/O pad 106.

Also, the page buffer 82, as illustrated in FIG. 14, is formed of page buffers 82a and 82b. The page buffer 82a amplifies a potential of a bit line connected to a normal memory cell and latches the amplified result. The page buffer 82b is a page buffer that is replaced together with a normal memory cell and a bit line when a memory cell or a bit line connected to the page buffer 82a are defective. That is, if one of page buffer units of the page buffer 82a is defective, then it is repaired with one of page buffer units of the page buffer 82b.

The column repair circuit 84 is configured to repair a defective page buffer unit with a page buffer unit of the page buffer 82b. For example, the column repair circuit 84 controls the column coding circuit 83 when a column address indicating a location of a defective page buffer is received at a data read operation on a memory cell transistor. That is, under a control of the column repair circuit 84, a page buffer unit of the page buffer 82b is selected instead of a defective page buffer unit of the page buffer 82a. Thus, data in a selected page buffer unit is read out to a peripheral circuit via the data buses Data Bus_2 and Data Bus_1 and the I/O pad 106. A column address indicating a location of a defective page buffer includes repair information illustrated in FIG. 14. The repair information is detected via a semiconductor tester device (memory tester) during a test operation after fabrication and then is stored in a system storage area of a memory array 101, for example, before shipping.

Meanwhile, when a column address indicating a location of a defective page buffer is received at a data write operation on a memory cell transistor, the column repair circuit 84 controls the column coding circuit 83 such that a page buffer unit of the page buffer 82b is selected instead of a defective page buffer unit of the page buffer 82a. Thus, data from the I/O pad is provided via the data buses Data Bus_2 and Data Bus_1 to a page buffer unit of the page buffer 82b, not a defective page buffer unit.

The data buses Data Bus_1 and Data Bus_2 are wirings to transfer data between the page buffer 82 and the I/O pad 106 and are formed of 8 or 16 lines. The I/O pad (or, interface unit) 106 is an external terminal to transfer data between the NAND flash memory 80 and the NAND controller 90.

An I/O pad (or, interface unit) 106c of the NAND controller 90 is an external terminal to transfer data between the NAND flash memory 80 and the NAND controller 90.

At a data read operation of the NAND flash memory 80, the ECC engine (ECC circuit) 87 receives data (including data before repairing, but probability that the data includes an error exists) from the NAND flash memory 80 via the I/O pad (or, interface unit) 106c. The ECC circuit 87 performing ECC processing (decode processing) on the received data based on, for example, parity data stored therein and outputs clear data after error correction to an external device. Meanwhile, at a data write operation of the NAND flash memory 80, the ECC circuit 87 generates parity data from data received from an external device and 1-page data of the NAND flash memory 80 before the received data is written. The ECC circuit 87 stores the parity data therein and outputs write-in data to the NAND flash memory 80 via the I/O pad (or, interface unit) 106c.

As described above, in a typical NAND flash memory, ECC processing is executed at an external device. For this reason, data when the ECC processing is performed is data that passes through the column repair circuit 84, that is, data after defective column repairing.

A time for the ECC processing is required because the NAND flash memory 80 sends data only using a bus width of the I/O pad 106 at the ECC processing. To widen a bus width at the ECC processing is considered to shorten a time for the ECC processing. For example, there is considered to widen bus widths of the data buses Data Bus_1 and Data Bus_2 of the NAND flash memory 80.

However, if a bus width is doubled, the size of the column repair circuit 84 is also doubled to maintain a repair efficiency of defective bits constantly, that is, because of the probability that the number of defective bits input and repaired in the column repair circuit 84 is double the number of defective bits before a bus width is widened. Also, the circuit size of the I/O pad 106, for example, the number of pads disposed may increase. With the above description, if a bus width is widened to perform high-speed ECC processing, a chip size increases to repair defective bits.

Or, the ECC circuit 87 for ECC processing can be configured to be placed in the NAND flash memory 80. For example, there may be considered a semiconductor memory device which uses a part of outputting clear data as an I/O pad by eliminating the I/O pads 106 and 106c with the NAND flash memory 80 and the NAND controller 90 integrated. In this case, if a bus width is widened for high-speed ECC processing, a chip size increases to repair defective bits. Furthermore, since data input in the ECC circuit 87 is data after repairing of defective bits, that is, data passing through the column repair circuit 84, a time for the ECC processing increases as long as a time taken to repair defective bits via the column repair circuit 84.

SUMMARY

The present general inventive concept provides a semiconductor memory device to prevent an increase in a size of a column repair circuit to repair a defective page buffer connected to a normal memory cell or bit line with a defect-free page buffer and to transfer data to an error correcting code (ECC) circuit at a high speed.

Additional features and utilities of the present general inventive concept will be set forth in part in the description which follows and, in part, will be obvious from the description, or may be learned by practice of the general inventive concept.

The foregoing and/or other features and utilities of the present general inventive concept are achieved by providing a semiconductor memory device which includes a first data bus, a second data bus being independent from the first data bus, the number of lines of the first data bus being different from that of the second data bus, and a data transfer unit to transfer data by connecting the first data bus with bit lines, the number of which is equal to the number of lines of the first data bus, from among a plurality of bit lines when data is transferred to/from memory cells during a first operation mode and transfers data by connecting the second data bus with bit lines, the number of which is equal to the number of lines of the second data bus, from among the plurality of bit lines when data is transferred to/from memory cells during a second operation mode. The data transfer unit includes a first page buffer to latch data of a normal bit line connected to a normal memory cell, a second page buffer to latch data of a parity bit line connected to a parity memory cell, and a third page buffer that is replaced together with a normal memory cell and a normal bit line when a normal memory cell or a normal bit line connected to the first page buffer is defective or is replaced together with a parity memory cell and a parity bit line when a parity memory cell or a parity bit line connected to the second page buffer is defective. The first data bus is connected to the first, second, and third page buffers and the second data bus is connected to the first and third page buffers.

The third page buffer may previously store identification data indicating whether either one of the first and second page buffers is replaced and operates as the first page buffer or the second page buffer in response to the identification data.

The semiconductor memory device may further include an error correction code (ECC) circuit that is connected to the first data bus and corrects an error of output data of the first page buffer input in a data input/output unit based on output data of the second page buffer input in a parity data input/output unit; and a repair circuit which is connected to the first data bus and replaces a page buffer, connected to a defective parity memory cell or parity bit line, from among the second page buffer with the third page buffer during the first operation mode. If the identification data indicates that the second page buffer is replaced, the third page buffer outputs fixed data to a data input/output unit of the ECC circuit via the first data bus and parity data to a parity data input/output unit of the ECC circuit via the first data bus and the repair circuit when a data read operation of the first operation mode is selected, and parity data from a parity data input/output unit of the ECC circuit is input in the third page buffer without allowing an input of data from a data input/output unit of the ECC circuit, when a data write operation of the first operation mode is selected.

The first page buffer may include a page buffer control circuit configured to set an output of a page buffer, connected to a defective memory cell or bit line, to fixed data and the page buffer control circuit inhibits an input from the first data bus when a memory cell or a bit line is defective.

The foregoing and/or other features and utilities of the present general inventive concept may also be achieved by providing a data transfer unit including a first page buffer to store normal data, a second page buffer to store parity data, and a third page buffer configured to operate as a selected page buffer unit in the first and second page buffers to act as a shared page buffer at a repair operation on a defective column and a repair circuit configured to repair a page buffer unit of the second page buffer, associated with a defective parity memory cell or a defective parity bit line, with a buffer unit of the third page buffer.

The semiconductor memory device may further include an error correction code (ECC) circuit connected to a first data bus connected with the first, second, and third page buffers and configured to correct an error of output data of the first page buffer input in a data input/output unit, based on output data of the second page buffer.

In the third page buffer may be previously written identification data indicating a page buffer unit of either one of the first and second page buffers is repaired.

The data transfer unit, during a first operation mode, may connect first bit lines of a plurality of bit lines to the first data bus such that data is transferred, the number of the first bit lines being equal to the number of bus lines of the first data bus, and wherein the data transfer unit, during a second operation mode, connects second bit lines of the plurality of bit lines to the second data bus such that data is transferred, the number of the second bit lines being equal to the number of bus lines of the second data bus that is independent of the first data bus.

The second data bus may be connected to the first and third page buffers.

The third page buffer may be repaired together with a normal memory cell and a normal bit line when the normal memory cell or the normal bit line connected to the first page buffer is defective, and wherein the third page buffer is repaired together with a parity memory cell and a parity bit line when the parity memory cell or the parity bit line connected to the second page buffer is defective.

The first data bus is an error correction code (ECC) bus.

The number of buses of the second data bus may be more than that of the ECC bus.

The number of page buffer units in the third page buffer is less than that of the second page buffer.

The first page buffer may include a page buffer control circuit configured to set an output of a page buffer, connected to a defective memory cell or bit line, to fixed data, and wherein the page buffer control circuit inhibits writing from the first data bus when a memory cell or a bit line is defective.

The third page buffer may include a repair information storing unit to store identification data indicating whether a page buffer unit of either one of the first and second page buffers is repaired.

The semiconductor memory device may further include a column repair selecting unit configured to connect a page buffer unit of the third page buffer to a read error correction code (ECC) data bus or a write error correction code (ECC) data bus, based on the identification data.

If the identification data indicates repair information on the second page buffer, the third page buffer may output fixed data to a data input/output unit of the ECC circuit via the first data bus and parity data to a parity data input/output unit of the ECC circuit via the first data bus and the repair circuit during a data read operation of the first operation mode, and receives parity data from the parity data input/output unit of the ECC circuit with writing of data from the data input/output unit of the ECC circuit not permitted during a data write operation of the first operation mode.

The foregoing and/or other features and utilities of the present general inventive concept may also be achieved by providing a data transfer unit including a first page buffer to store normal data, a second page buffer to store parity data, and a third page buffer that is replaced together with one of normal data when the stored normal data is defective and parity data when the stored parity data is defective and a repair circuit configured to repair a page buffer unit of the second page buffer, associated with a defective parity memory cell or a defective parity bit line, with a buffer unit of the third page buffer.

An error correction code (ECC) circuit may be connected to a first data bus connected with the first, second, and third page buffers and configured to correct an error of output data of the first page buffer input in a data input/output unit, based on output data of the second page buffer.

The third page buffer may be previously written identification data indicating a page buffer unit of either one of the first and second page buffers is repaired.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
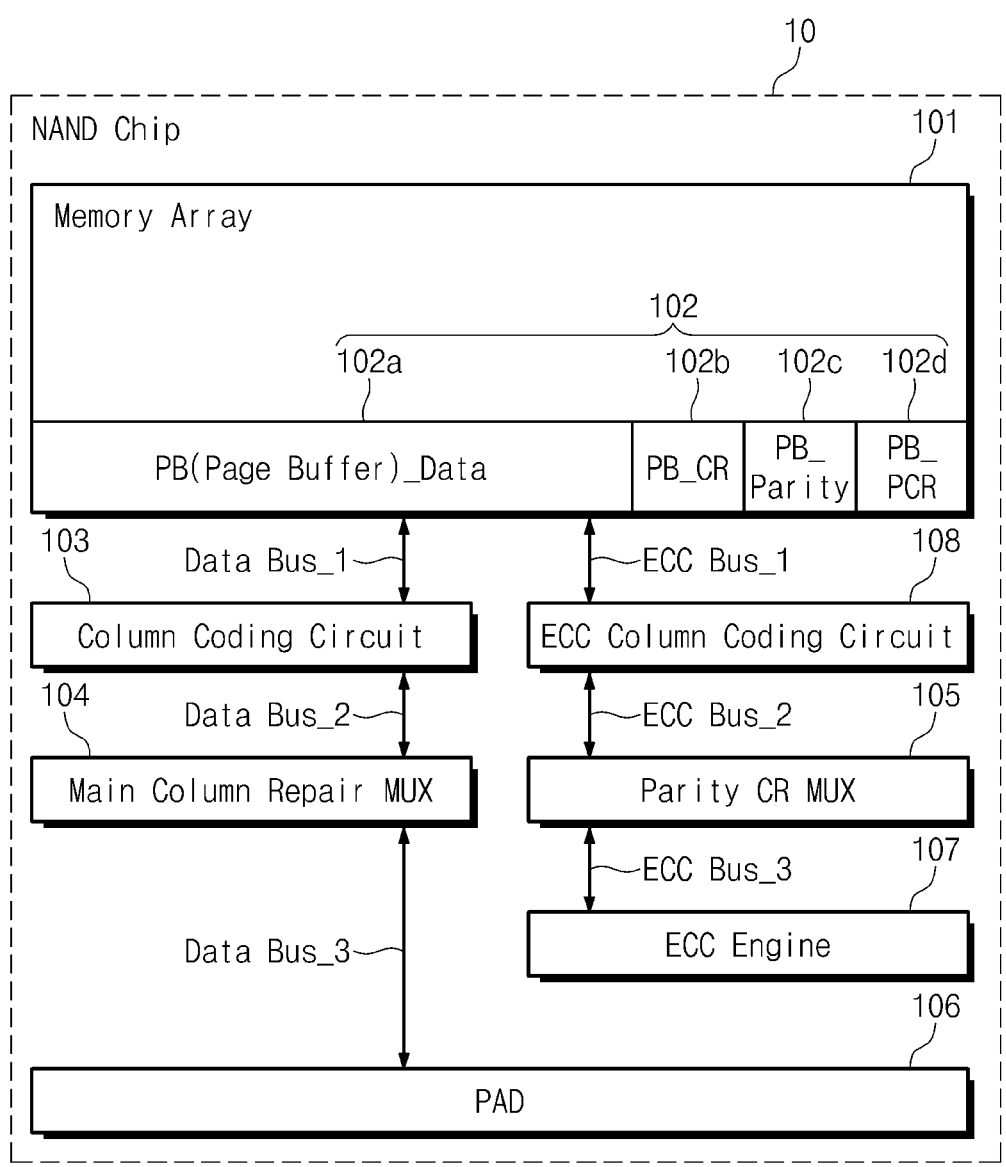
FIG. 1 is a diagram schematically illustrating a block configuration of a NAND flash memory.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a NAND flash memory 10. Referring to FIG. 1, a NAND flash memory 10 incorporates a memory array 101, a page buffer 102, a column coding circuit 103, and a main column repair multiplexer (MUX) 104. The NAND flash memory 10 may further include a parity column repair circuit (a.k.a., parity CR MUX) 105, an error correction code (ECC) column coding circuit 108, an input/output (I/O) pad 106, and an ECC circuit (a.k.a., ECC engine) 107. In FIG. 1, components that are identical to those of a NAND flash memory 80 illustrated in FIG. 14 are marked by the same reference numerals, and a description thereof is thus omitted.

In FIG. 1, Data Bus_1, Data Bus_2, and Data Bus_3 (second data bus) are wirings to transfer data between the page buffer 102 and the I/O pad 106 and are named "Data_Bus" later. Also, ECC Bus_1, ECC Bus_2, and ECC Bus_3 are wirings to transfer data between the page buffer 102 and the ECC engine 107 and are named "ECC_Bus" later.

Figure 14:
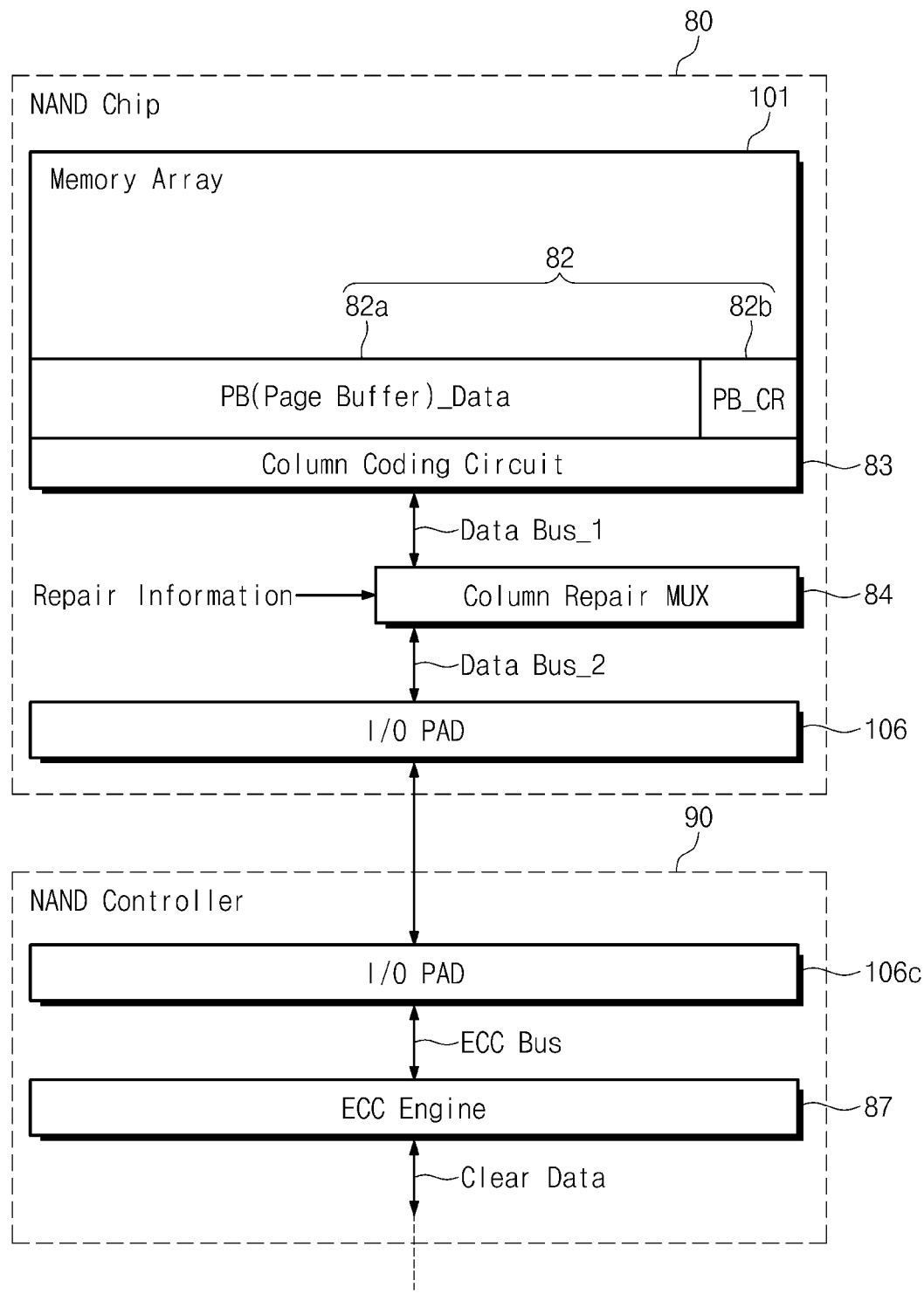
FIG. 14 is a diagram schematically illustrating a typical block configuration of a NAND flash memory.
Figure 15:
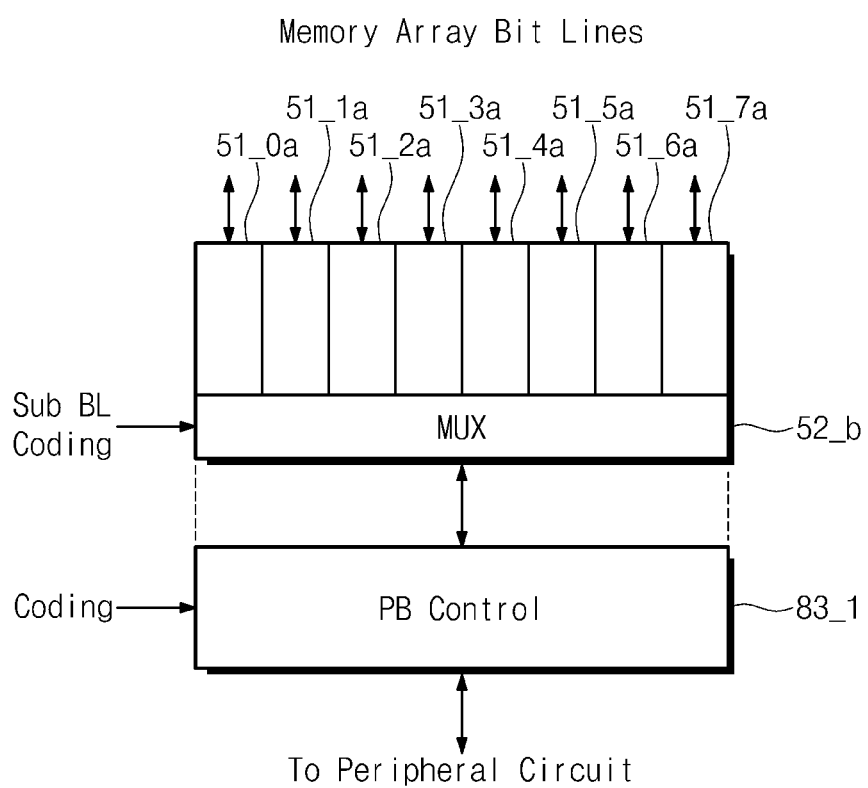
FIG. 15 is a diagram illustrating a page buffer unit of a page buffer.
Figure 16:
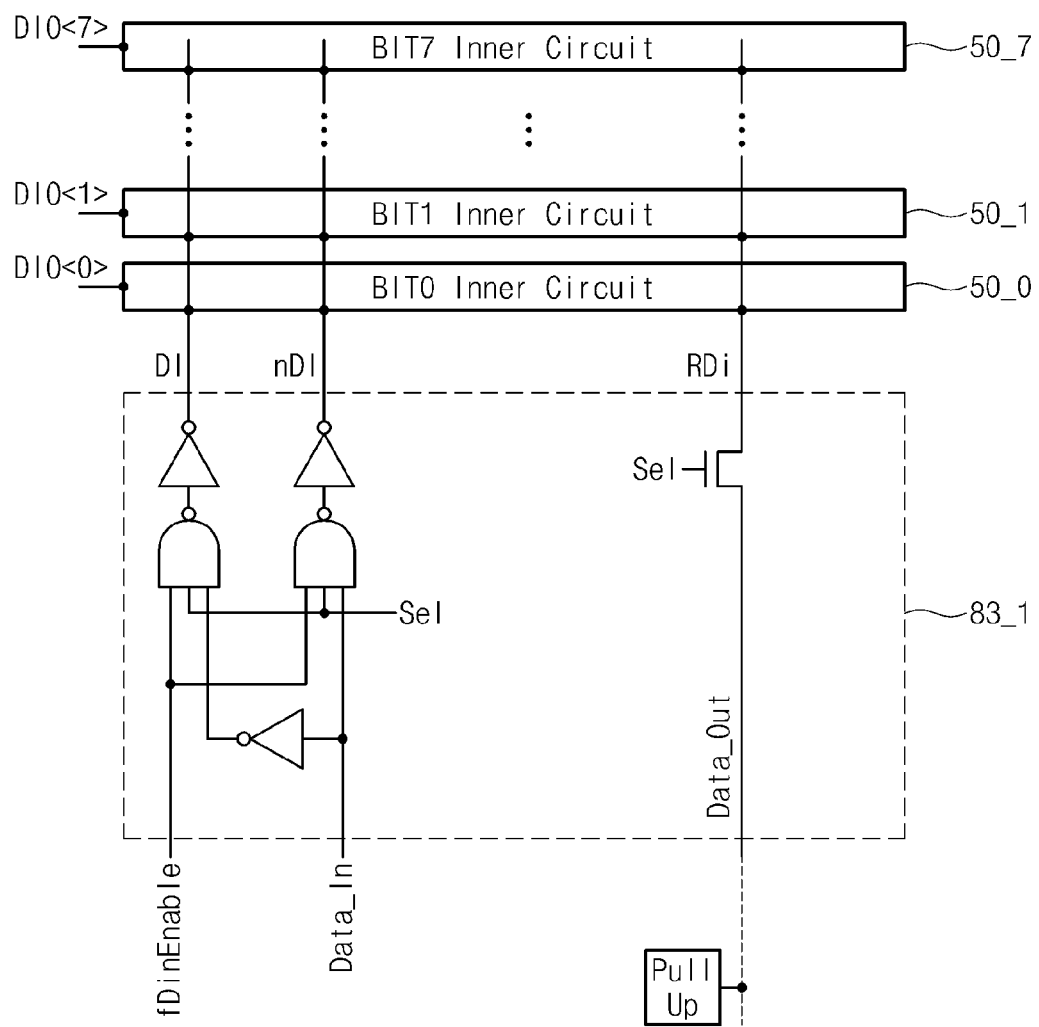
FIG. 16 is a diagram schematically illustrating an internal circuit configuration of a conventional page buffer unit.

Unlike a NAND flash memory 80 illustrated in FIG. 14, the NAND flash memory 10 includes the column coding circuit 103 and the ECC column coding circuit 108 instead of a column coding circuit 83. The column coding circuit 103 and the ECC column coding circuit 108 may be supplied with individual column addresses Coding. The column coding circuit 103 and the ECC column coding circuit 108 output a selection signal Sel_A or a selection signal Sel_B to a PB control circuit 60 of the page buffer 102 such that an output of a page buffer is connected to one of ECC Bus_1 and Data Bus_1 from a portion (corresponding to a multiplexer 52_b and a PB control circuit 83_1 illustrated in FIG. 15) directly connected to the page buffer 102.

In particular, the ECC column coding circuit 108 receives a column address Address B from the ECC circuit 107. The ECC column coding circuit 108 outputs a selection signal Sel_B to the PB control circuit 60 independently from a column address Address A provided to the column coding circuit 103 from an address control circuit (not illustrated), so an output of the page buffer 102 is connected to ECC Bus_1. An address control to connect an output of the page buffer 102 and ECC Bus_1 or Data Bus_1 may be made independently.

In a conventional NAND flash memory, also, an output of the page buffer (hereinafter, naming a data bus an IO bus) is shared at a first operation mode and a second operation mode. In contrast, in the NAND flash memory 10, the IO bus an output of the page buffer is independent at the first operation mode and the second operation mode, not shared.

Thus, a circuit that affects a high-speed data transfer of a column repair circuit 104 (to be described later) is unnecessary on a path ranging from an output of the page buffer to the ECC circuit 107, thereby implementing a high-speed data transfer. Also, a second data bus may have a bus width corresponding to conventional repair efficiency. By this, a circuit size of the column repair circuit 104 does not increase, thereby preventing an increase in a chip size. Furthermore, the ECC column coding circuit 108, the parity column repair circuit 105, ECC Bus_1 to ECC Bus_3, and the ECC circuit 107 may be eliminated even through the NAND flash memory 10 is changed into a NAND flash memory that does not include an ECC circuit. Thus, it is easy to design a flash memory.

The page buffer 102, as illustrated in FIG. 1, includes PB_Data, PB_CR, PB_Parity, and PB_PCR (hereinafter, referred to as page buffers 102a, 102b, 102c, and 102d).

The page buffer 102a amplifies a potential of a bit line connected to a normal memory cell and latches an amplified result. When a selection signal Sel_A is received from the column coding circuit 103 at a data read operation of a normal mode (second operation mode), the page buffer 102a outputs the amplified result to the I/O pad 106 as a data-out signal Data_Out_A via Data Bus_1, Data Bus_2, and Data Bus_3 (second data bus).

Meanwhile, when a selection signal Sel_B is received from the column coding circuit 103 at a data read operation of an ECC mode (first operation mode), the page buffer 102a outputs the amplified result to the I/O pad 106 as a data-out signal Data_Out_B via ECC Bus_1, ECC Bus_2, and ECC Bus_3 (first data bus).

Also, when the selection signal Sel_A is received from the column coding circuit 103 at a data write operation of the normal mode, the page buffer 102a receives write-in data from the I/O pad 106 via Data Bus_3, Data Bus_2, and Data Bus_1 as a data-in signal Data_In_A. Meanwhile, when the selection signal Sel_B is received from the ECC column coding circuit 108 at a data write operation of the ECC mode, the page buffer 102a receives an output of the ECC circuit 107 via ECC Bus_3, ECC Bus_2, and ECC Bus_1 as a data-in signal Data_In_B.

The page buffer 102b is a page buffer that is replaced together with a normal memory cell and a bit line when a normal memory cell or bit line connected to the page buffer 102a is defective. That is, if one of page buffer units of the page buffer 102a is defective, it is repaired with one of page buffer units of the page buffer 102b. In addition, an operation of the page buffer 102b is the same as that of the page buffer 102a, and a description thereof is thus omitted.

To replace a page buffer unit of the page buffer 102a with that of the page buffer 102b may be made by the column repair circuit 104. Where a column address (selection signal Sel_A) to select a defective page buffer unit of the page buffer 102a is received, the column repair circuit 104 executes a control such that the column coding circuit 103 selects a page buffer unit of the page buffer 102b.

The page buffer 102c amplifies a potential of a bit line connected to a parity memory cell (memory cell transistor to perform ECC processing having the same configuration as a normal memory cell) and latches an amplification result. In addition, parity data that a parity memory cell stores is not output to an external device via the I/O pad 106 at a normal mode. Meanwhile, receiving a selection signal Sel_B from ECC column coding circuit 108 at a data read operation of the ECC mode, the page buffer 102c outputs the amplification result to the ECC circuit 107 via the ECC Bus_1, ECC Bus_2, and ECC Bus_3 as a data-out signal Data_Out_B.

Also, parity data that a parity memory cell stores is not received from an external device via the I/O pad 106 at a normal mode. Meanwhile, receiving a selection signal Sel_B from the ECC column coding circuit 108 at a data write operation of the ECC mode, the page buffer 102c receives parity data being an output of the ECC circuit 107 as a data-in signal Data_In_B via the ECC Bus_3, ECC Bus_2, and ECC Bus_1.

The page buffer 102d is a page buffer that is replaced together with a parity memory cell and a bit line when a parity memory cell or bit line connected to the page buffer 102c is defective. That is, if a page buffer unit of page buffer units of the page buffer 102c is defective, it is replaced with a page buffer unit of the page buffer 102d. In addition, an operation of the page buffer 102d is the same as that of the page buffer 102c, and a description thereof is thus omitted.

To repair a page buffer unit of the page buffer 102c with that of the page buffer 102d may be made by the parity column repair circuit 105. If a column address (selection signal Sel_B to be described later) to select a defective page buffer unit of the page buffer 102c is received, the parity column repair circuit 105 executes a control such that the ECC column coding circuit 108 selects a page buffer unit of the page buffer 102d.

Figure 2:
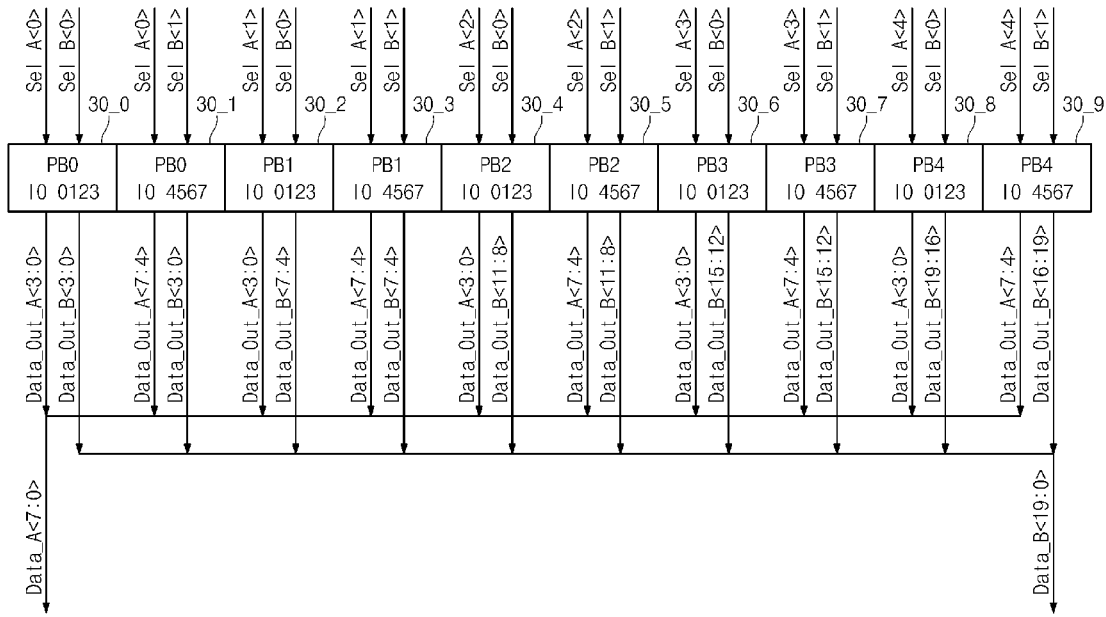
FIG. 2 is a diagram illustrating a data read operation of a portion corresponding to a page buffer, a column coding circuit, and an ECC column coding circuit illustrated in FIG. 1.
Figure 3A:
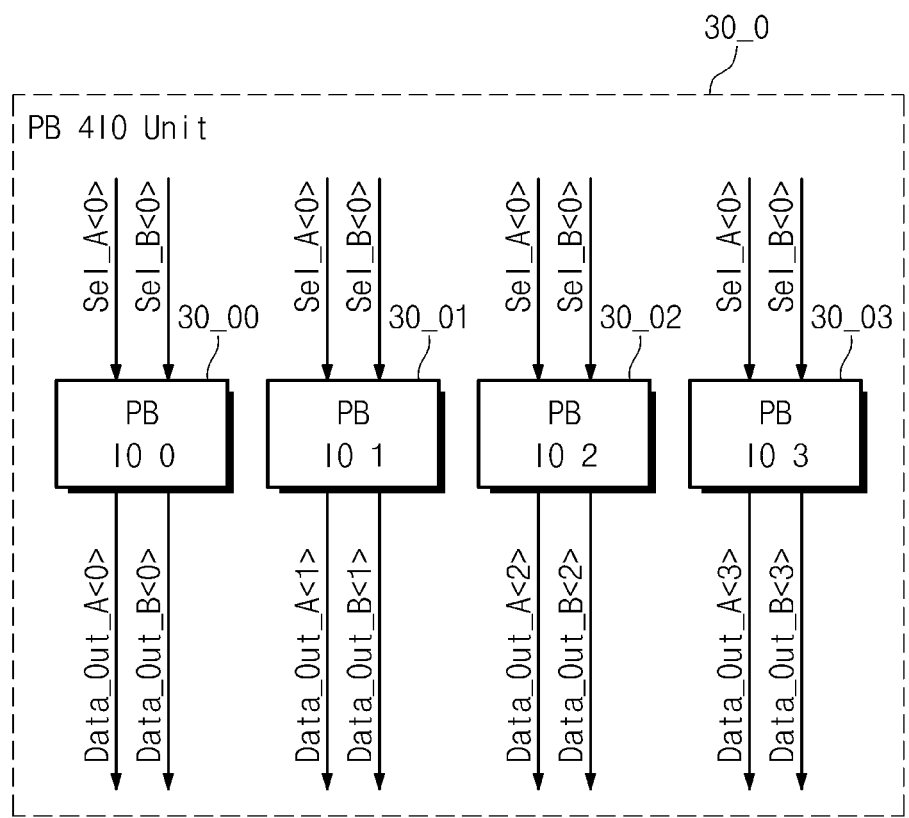
FIGS. 3A-3B are diagrams schematically illustrating an internal configuration of a PB unit and an internal configuration of a PB 4IO unit illustrated in FIG. 2.
Figure 3B:
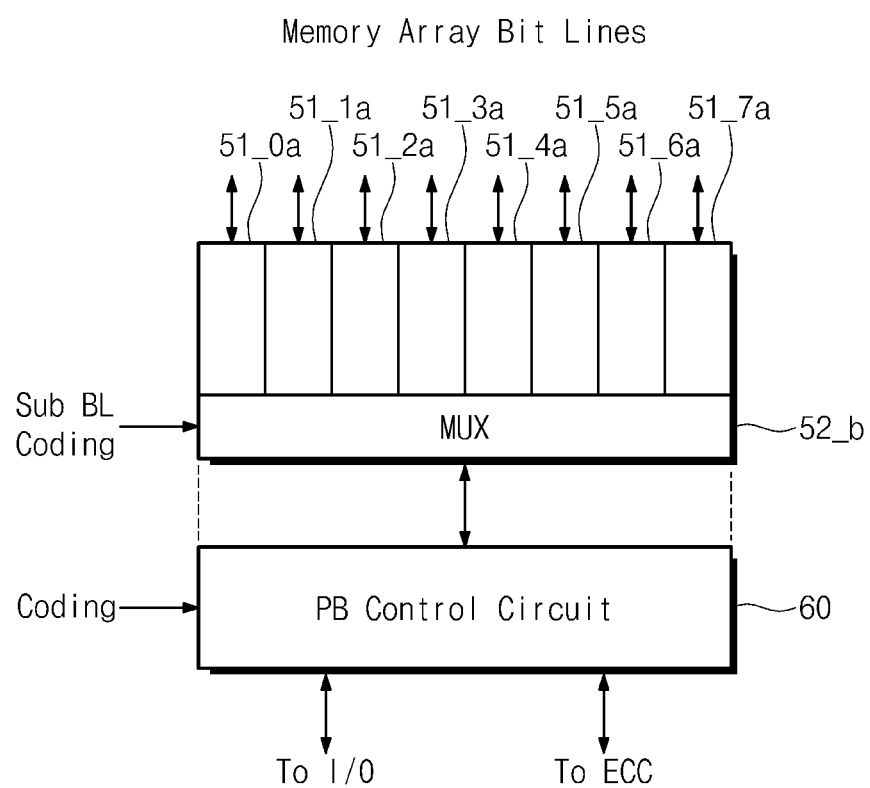
Figure 4:
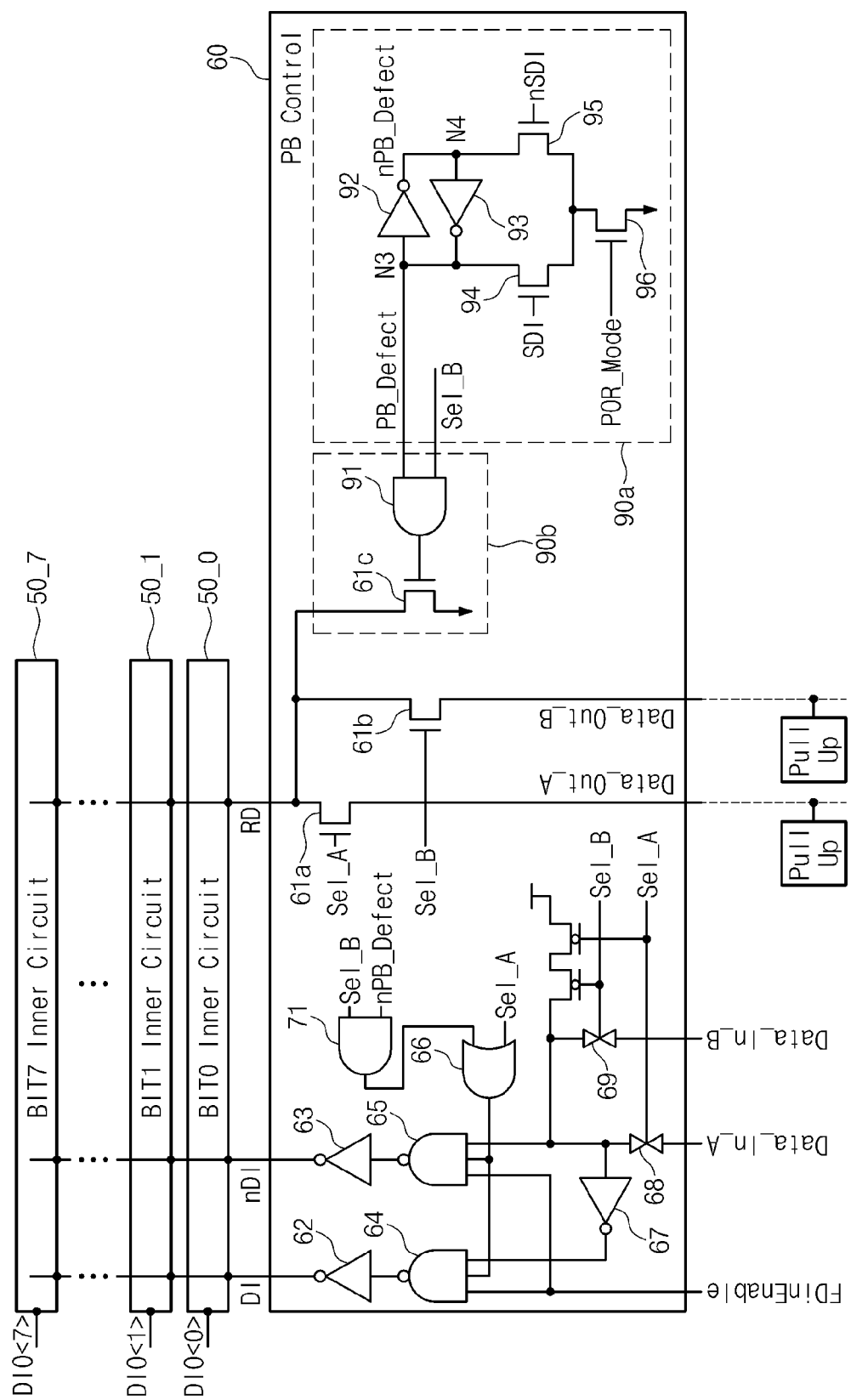
FIG. 4 is a diagram schematically illustrating an internal circuit configuration of a PB unit.
Figure 5:
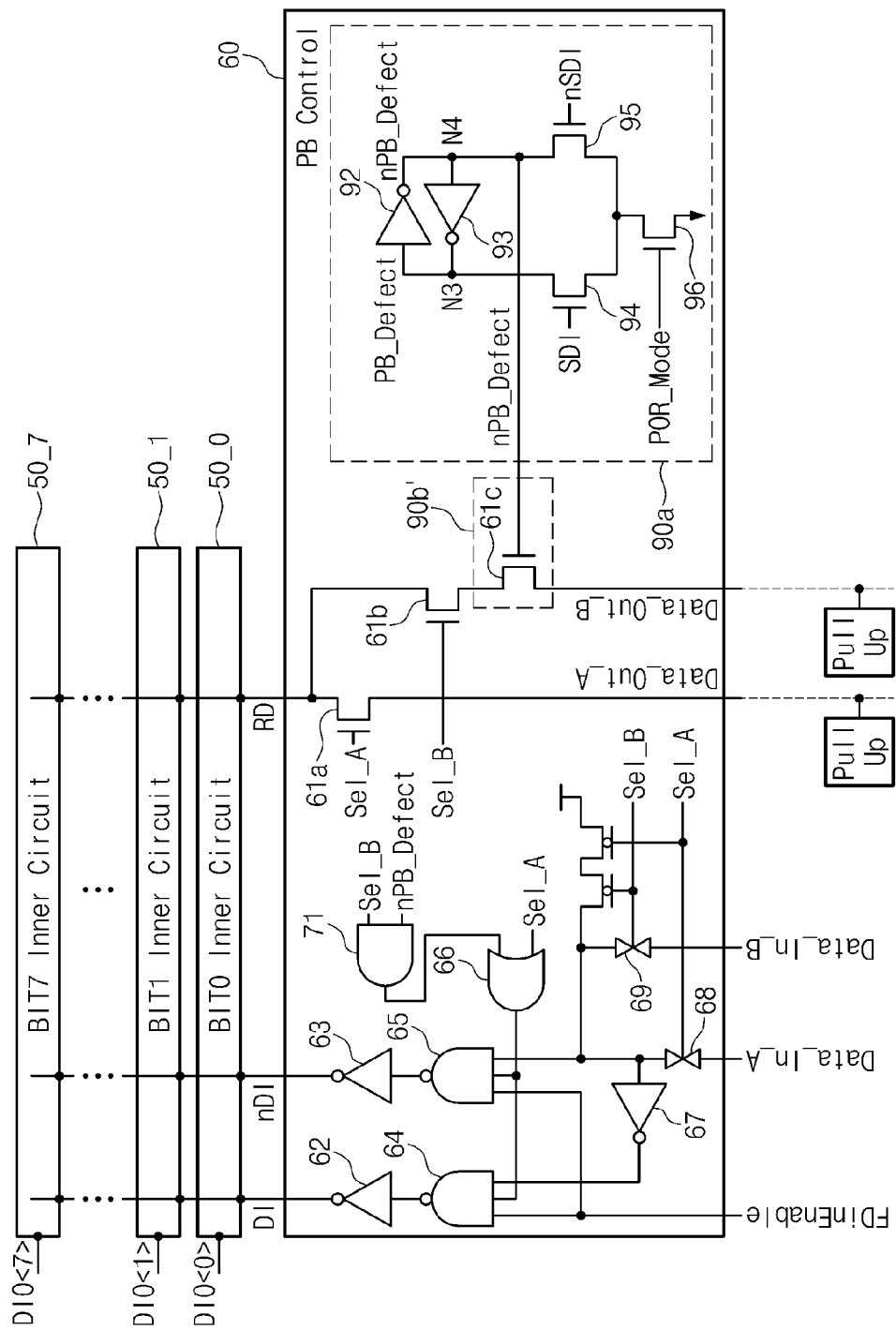
FIG. 5 is a diagram schematically illustrating another internal circuit configuration of a PB unit.
Figure 6:
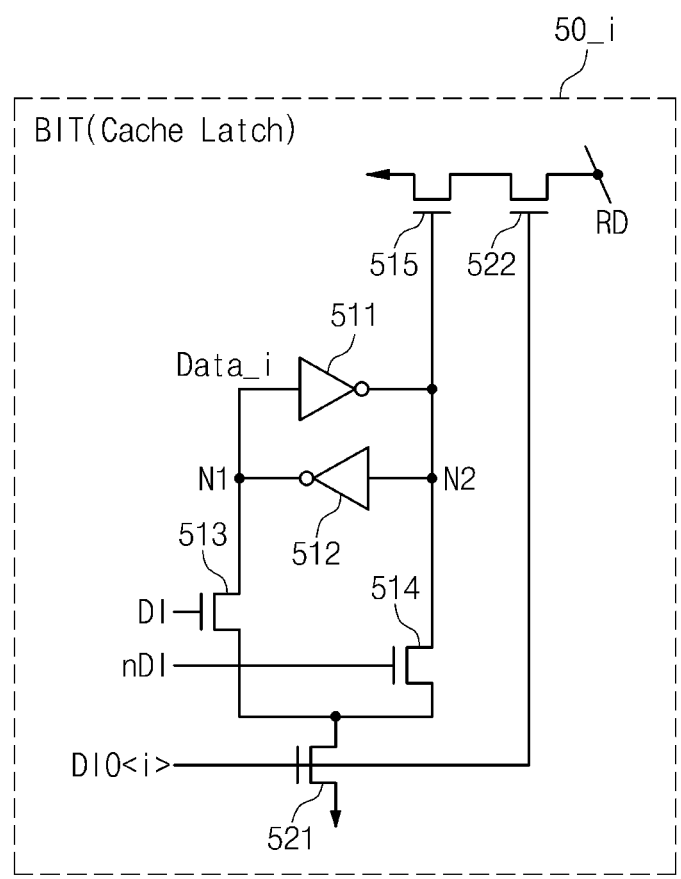
FIG. 6 is a diagram schematically illustrating a circuit configuration of a bit inner circuit 50_$i$ ($i$ being 0 to 7) illustrated in FIG. 4 and FIG. 5.

The page buffers 102a to 102d of the page buffer 102 all are configured the same, and a circuit configuration thereof will be described with reference to FIGS. 2 through 6. FIG. 2 is a diagram schematically illustrating a data read operation of a portion corresponding to a page buffer 102, a column coding circuit 103, and an ECC column coding circuit 108 illustrated in FIG. 1. FIGS. 3A-3B are diagrams schematically illustrating a PB 4IO unit and a PB unit illustrated in FIG. 2. FIG. 4 is a circuit diagram schematically illustrating a PB unit. FIG. 5 is a diagram schematically illustrating a configuration of internal other circuits of a PB unit. FIG. 6 is a circuit diagram schematically illustrating a bit inner circuit 50_i (i being an integer of 0 to 7) illustrated in FIGS. 4 and 5.

Referring to FIG. 2, a portion corresponding to a page buffer 102, a column coding circuit 103, and an ECC column coding circuit 108 illustrated in FIG. 1 has a PB 4IO unit that latches four data from four IO lines and reads the latched data from a first data bus or a second data bus or writes data with respect to four IO lines.

In FIG. 2, there are illustrated ten PB 4IOs, that is, PB0 IO 0123 (PB 4IO unit) 30_0, PB0 IO 4567 (PB 4IO unit) 30_1, PB1 IO 0123 (PB 4IO unit) 30_2, PB1 IO 4567 (PB 4IO unit) 30_3, PB2 IO 0123 (PB 4IO unit) 30_4, PB2 IO 4567 (PB 4IO unit) 30_5, PB3 IO 0123 (PB 4IO unit) 30_6, PB3 IO 4567 (PB 4IO unit) 30_7, PB4 IO 0123 (PB 4IO unit) 30_8, and PB4 IO 4567 (PB 4IO unit) 30_9.

Here, an IO line is an input/output line that is installed between a multiplexer 52_b and a PB control circuit 60 as will be more fully described below. In exemplary embodiments, the IO line is electrically connected to any one of eight bit lines through a multiplexer 52_b and eight bit circuits 51_0a to 51_7a. That is, the IO line is a signal line through which memory cell transistor data or data read from a memory cell transistor is transferred.

Referring to FIG. 3A, the PB 4IO units illustrated in FIG. 2 has the same configuration. In FIG. 3A, there is illustrated the PB 4IO unit 30_0 illustrated in FIG. 2. The PB 4IO unit 30_0 consists of four PB units 30_00 to 30_03.

When a selection signal Sel_A<0> having an active level (high level) is provided from a column coding circuit 103, each of the PB units 30_00 to 30_03 connects an IO line and a data bus (second bus) (data bus Data_A<7:0> as will be described below). In this case, as illustrated in FIG. 3A, four data-out bit signals Data_Out_A<0> to Data_Out_A<3> are read from four IO lines onto a data bus Data_A<3:0>.

Also, when a selection signal Sel_B<0> having an active level (high level) is provided from an ECC column coding circuit 108, each of the PB units 30_00 to 30_03 connects an IO line and an ECC bus (first bus) (data bus Data_B<19:0> as will be described below). In this case, as illustrated in FIG. 3A, four data-out bit signals Data_Out_B<0> to Data_Out_B<3> are read from four IO lines onto a data bus Data_B<3:0>.

Referring to FIG. 3B, each of PB units illustrated in FIG. 3A comprises eight bit circuits 51_1a to 51_7a (configured the same as those in FIG. 15), a multiplexer 52_b (configured the same as that illustrated in FIG. 18), and a page buffer (PB) control circuit 60 of the inventive concept.

Below, a detailed circuit configuration of a PB unit will be more fully described with reference to FIGS. 4 and 6.

In FIG. 6, in each of the bit inner circuits 50_0 through 50_7, a data sensing unit and a latch unit to perform a write operation and a driver unit to drive a signal line at a read operation are illustrated as being implemented using transistors and inverter circuits. In addition, a combination of bit circuits 51_0a to 51_7a and a multiplexer 52_b illustrated in FIG. 3B corresponds to the bit inner circuits 50_0 to 50_7. That is, since a bit inner circuit is selected by a selection signal DIO, it partially has functions of a bit circuit and a multiplexer 52_b. Also, a bit inner circuit illustrated in FIG. 6 is configured the same as a bit inner circuit of a conventional PB unit illustrated in FIG. 15.

As illustrated in FIG. 6, a bit inner circuit 50_i (i being an integer of 0 to 7 and eight bit inner circuits having the same structure) is formed of an inverter circuit 511, an inverter circuit 512, a transistor 513, a transistor 514, a transistor 515, a transistor 521, and a transistor 522. Here, the transistors 513, 514, 515, 521, and 522 may be an N-channel MOS transistor.

A latch unit of the bit inner circuit 50_i is formed of the inverter circuits 511 and 512. Here, an input terminal of the inverter 511 and an output terminal of the inverter 512 are connected to a connection node N1, and an output terminal of the inverter 511 and an input terminal of the inverter 512 are connected to a connection node N2. The connection node N1 is connected to a memory cell transistor (not illustrated) through a bit line. Data that a memory cell transistor stores appears on the connection node N1 as Data_i at a read operation. Data that is to be stored in a memory cell transistor appears on the connection node N1 as Data_i at a write operation. For example, when a memory cell transistor stores a low level (data 0), a voltage of Data_i has a low level. When a memory cell transistor stores a high level (data 1), a voltage of Data_i has a high level.

In the bit inner circuit 50_i, the driver unit includes a transistor 515 and a transistor 522. The transistor 522 has a drain connected to receive a read signal RD, a gate connected to receive a selection signal DIO<i>, and a source connected to a drain of the transistor 515. The transistor 515 has a drain connected to the source of the transistor 522, a gate connected to the connection node N2, and a source grounded.

Here, the selection signal DIO<i> (I=0 to 7) may be Sub BL Coding illustrated in FIG. 3B. The column coding circuit 103, for example, sets one of the selection signals DIO<i> to a high level based on a 3-bit address signal from an address control circuit (not illustrated), or the ECC column coding circuit 108 sets one of the selection signals DIO<i> to a high level based on a 3-bit address signal from an ECC circuit 107. Thus, one of bit inner circuits 50_0 to 50_7 illustrated in FIG. 4 may be selected.

With the above-described configuration, if the selection signal DIO<i> has a high level at a data read operation on a memory cell transistor, a logical level of the read signal RD is set to the same logical level as Data_i. That is, when Data_i is at a high level with the read signal RD pre-charged to a high level, for example, the transistor 515 is turned off, the transistor 522 is turned on and the read signal RD retains a high level. When Data_i is at a low level, the transistor 515 is turned on, the transistor 522 is turned on, and the bit inner circuit 50_i changes the read signal RD from a high level to a low level.

A line of the read signal RD is connected to a PB control circuit 60 as illustrated in FIG. 4. At a first operation mode (ECC mode), a line of the read signal RD is connected to an ECC bus in response to a selection signal Sel_B (column address signal that the ECC column coding circuit 108 outputs). Thus, Data_i of the bit inner circuit 50_i is output on the ECC bus as a data-out signal Data_Out_B.

Meanwhile, at a second operation mode (normal mode), a line of the read signal RD is connected to a data bus in response to a selection signal Sel_A (column address signal that the column coding circuit 103 outputs). Thus, Data_i of the bit inner circuit 50_i is output on the data bus as a data-out signal Data_Out_A.

Returning to FIG. 6, the transistors 513, 514, and 521 constitute a sensing unit of the bit inner circuit 50_i. The transistor 513 has a drain connected to the connection node N1, a gate connected to receive a write signal DI, and a source connected to a drain of the transistor 521. The transistor 514 has a drain connected to the connection node N2, a gate connected to receive a write signal nDI, and a source connected to the drain of the transistor 521. The transistor 521 has a drain connected to the source of the transistor 513 and the source of the transistor 513, a gate connected to receive a selection signal DIO<i>, and a source grounded.

The lines of the write signals DI and nDI are connected to the PB control circuit 60 as illustrated in FIG. 4. As will be described below, as they are connected to a data bus ECC Bus according to the selection signal Sel_B at the first operation mode, a data-in signal Data_In_B is received from ECC Bus. Thus, the PB control circuit 60 varies one of the write signals DI and nDI from a low level to a high level in response to a level of the data-in signal Data_In_B. At this time, the other of the write signals DI and nDI retains a low level.

Meanwhile, at the second operation mode, connection to Data Bus is made according to the selection signal Sel_A to receive a data-in signal Data_In_A from the Data Bus. Thus, the PB control circuit 60 varies one of the write signals DI and nDI from a low level to a high level in response to a level of the data-in signal Data_In_A. At this time, the other of the write signals DI and nDI retains a low level.

With the above-described structure, if a selection signal DIO<i> goes to a high level at a data write operation on a memory cell transistor, a Data_i level of the bit inner circuit 50_i is decided according to levels of the write signals DI and nDI. In detail, when one of a data-in signal Data_In_A and a data-in signal Data_In_B is at a low level (data 0), the PB control circuit 60 outputs a high level of write signal DI and a low level of write signal nDI. By this, in the bit inner circuit 50_i, the transistor 513 is turned on and the transistor 514 is turned off. At this time, the connection node N1 is set to a low level, and the connection node N2 is set to a high level. Thus, Data_i has the same logical low level (data 0) as a data bus.

Meanwhile, when the data-in signal Data_In_A or the data-in signal Data_In_B is at a high level (data 1), the PB control circuit 60 outputs a low level of write signal DI and a high level of write signal nDI. By this, in the bit inner circuit 50_i, the transistor 513 is turned off, and the transistor 514 is turned on. At this time, the connection node N1 is set to a high level and the connection node N2 is set to a low level. This means that Data_i has the same logical high level (data 1) as the data bus.

Returning to FIG. 4, the PB control circuit 60 comprises a write unit performing a data transfer from a data bus to a page buffer and a read unit performing a data transfer from a page buffer to a data bus. The read unit of the PB control circuit 60 is formed of transistors 61a and 61b. The transistors 61a and 61b may be an NMOS transistor. The transistor 61a has a drain connected to a line of the read signal RD, a gate connected to receive the selection signal Sel_A, and a source connected to a data bus (second data bus). The transistor 61b has a drain connected to receive the read signal RD, a gate connected to receive the selection signal Sel_B, and a source connected to ECC Bus (first data bus).

Here, the selection signal Sel_A may be a column address signal that a column coding circuit 103 generates in response to address bits, for example, an address Address A received from an address control circuit (not illustrated). The selection signal Sel_B may be a column address signal that an ECC column coding circuit 108 generates in response to a part of address bits, for example, an address Address B received from an ECC circuit 107 illustrated in FIG. 1.

Receiving the selection signal Sel_B having a high level from the ECC column coding circuit 108 at a data read operation of an ECC mode (first operation mode), the read unit of the PB control circuit 60 turns on the transistor 61b such that a line of the read signal RD is connected to ECC Bus. Thus, data of memory cell transistors (Data_i of a bit inner circuit) stored in the bit inner circuits 50_0 to 50_7 are output to the ECC Bus as a data-out signal Data_Out_B.

In case the selection signal Sel_A having a high level is received from the column coding circuit 103 at a data read operation of a normal mode (second operation mode), the read unit of the PB control circuit 60 turns on the transistor 61a such that a line of the read signal RD is connected to Data Bus. Thus, data of memory cell transistors stored in the bit inner circuits 50_0 to 50_7 are output to Data Bus as a data-out signal Data_Out_A.

The read unit of the PB control circuit 60 has the following structure such that when a memory cell transistor or a bit line connected to a memory cell transistor is abnormal, in the page buffers 102a and 102c, data provided to the ECC circuit 107 has fixed data (fixed to data 0) at a data read operation of an ECC mode.

That is, the read unit of the PB control circuit 60 comprises a defect information storing unit 90a and a data fixing unit 90b as illustrated in FIG. 4.

The defect information storing unit 90a comprises inverter circuits 92 and 93 and transistors 94, 95, and 96. Here, the transistors 94, 95, and 96 may be an N-channel MOS transistor.

A latch unit of the defect information storing unit 90a is formed of the inverter circuits 92 and 93. The inverter circuit 92 has an output terminal connected to a connection node N4 and an input terminal of the inverter 93 and an input terminal connected to a connection node N3 and an output terminal of the inverter circuit 93.

The connection node N3 is connected to a first input terminal of the AND circuit 91. The connection node N3 provides a defect signal PB_Defect indicating that data stored in the latch unit is defective. The connection node N4 provides a defect signal nPB_Defect indicating that data stored in the latch unit is defective.

A sensing unit of the defect information storing unit 90a comprises transistors 94, 95, and 96. The transistor 94 has a drain connected to the connection node N3, a gate connected to a line of a defect information signal SDI, and a source connected to a drain of the transistor 96. The transistor 95 has a drain connected to the connection node N4, a gate connected to a line of a defect information signal nSDI, and a source connected to the drain of the transistor 96. The transistor 96 has a drain connected to the source of the transistor 94 and the source of the transistor 95, a gate connected to a line of a power-on reset signal POR_Mode, and a source grounded.

Here, the defect information signal SDI and the defect information signal nSDI are signals indicating whether a bit line connected to the PB control circuit 60 or a memory cell transistor connected to a corresponding bit line is defective. In the event that a test result executed after fabrication indicates that a bit line connected to the PB control circuit 60 is defective, the defect information signal SDI is set to data 0 (low level) and the defect information signal nSDI is set to data 1 (high level). Or, in the event that a test result executed after fabrication indicates that a bit line connected to the PB control circuit 60 is not defective, the defect information signal SDI is set to a high level and the defect information signal nSDI is set to a low level. Before shipment, such defect information signals are stored at a storage area for system, for example, of the NAND flash memory 10 because they are in connection with the selection signal Sel_B indicating a location of the PB control circuit 60.

Also, the power-on reset signal POR_Mode is a signal maintaining a high level during a predetermined time period (time period where the defect information signals are transferred to the PB control circuit 60 from the storage area corresponding to the system) after the NAND flash memory 10 is powered up.

When the NAND flash memory 10 is powered up, the power-on reset signal POR_Mode goes to a high level. If a bit line connected to the PB control circuit 60 is defective, the defect information storing unit 90a turns off the transistor 94 and turns on the transistor 95. By this, the node N3 is set to a high level, and the node N4 is set to a low level. In this case, the defect signal PB_Defect has a high level. Since the power-on reset signal POR_Mode goes to a low level after a transfer period, the defect information storing unit 90a maintains the defect signal PB_Defect by a high level during a period where a power is supplied to the NAND flash memory 10.

When the NAND flash memory 10 is powered up, the power-on reset signal POR_Mode goes to a high level. If a bit line connected to the PB control circuit 60 is not defective, the defect information storing unit 90a turns on the transistor 94 and turns off the transistor 95. By this, the node N3 is set to a low level, and the node N4 is set to a high level. In this case, the defect signal PB_Defect has a low level. Since the power-on reset signal POR_Mode goes to a low level after a transfer period, the defect information storing unit 90a maintains the defect signal PB_Defect by a low level during a period where a power is supplied to the NAND flash memory 10.

The data fixing unit 90b is formed of the AND circuit 91 and a transistor 61c. Here, the transistor 61c is an NMOS transistor. The AND circuit 91 is a 2-input 1-output logic circuit. The AND circuit 91 has a first input terminal connected to the connection node N3 and a second input terminal connected to a line of the selection signal Sel_A, and an output terminal connected to a gate of the transistor 61c. The transistor 61c has a drain connected to a line of a read signal RD, a gate connected to the output terminal of the AND circuit 91, and a source grounded.

In the event that a bit line connected to the PB control circuit 60 is not defective, the defect signal PB_Defect has a low level. In this case, since the AND gate 91 outputs a low level of output signal, the transistor 61c of the data fixing unit 90b is turned off. That is, the data fixing unit 90b does not operate.

Meanwhile, in the event that a bit line connected to the PB control circuit 60 is defective, the defect signal PB_Defect has a high level. When ECC is used, that is, at an ECC mode, if a high level of selection signal Sel_B is provided to the AND circuit 91, the AND circuit 91 outputs a high level of output signal; the transistor 61c is turned on in response to the output of the AND circuit 91. In this case, ECC Bus_1 is grounded such that Data_Out_B is fixed to a low level (GND level). That is, in the event that a bit line connected to the PB control circuit 60 is defective, the PB control circuit 60 acts as a data fixing circuit that outputs read data Data_Out_B having a fixed level (low level) to ECC Bus_1 at the ECC mode.

In addition, at a data read operation of a normal mode, since the PB control circuit 60 is selected by the selection signal Sel_A, the AND circuit 91 outputs a low-level signal. In this case, the data fixing unit 90b being an additional circuit does not operate. If the defect signal PB_Defect is directly provided to a gate of the transistor 91c without using the AND circuit 91, the read signal RD is fixed to a low level when a bit line connected to the PB control circuit 60 is defective. That is, the PB control circuit 60 acts as a data fixing circuit that outputs a fixed level (low level) of read data Data_Out_A on Data Bus_1 when the selection signal Sel_A is received at a normal mode and outputs a low level of read data Data_Out_B when the selection signal Sel_B is received at an ECC mode.

The defect information storing unit 90a and the data fixing unit 90b illustrated in FIG. 4 may be implemented to have a configuration of FIG. 5. FIG. 5 is a diagram schematically illustrating another configuration of an inner circuit of a PB unit. In FIG. 5, constituent elements that are the same as those in FIG. 4 are marked by the same reference numerals, and a description thereof is thus omitted.

The defect information storing unit 90a illustrated in FIG. 5 is configured the same as that illustrated in FIG. 4, but the data fixing unit 90b is replaced with a data fixing unit 90b'. A signal on a connection node N4 of the defect information storing unit 90a is used as a defect signal nPB_Defect. The data fixing unit 90b' is formed of a transistor 61c. The transistor 61c has a source connected to ECC Bus (first data bus). The transistor 61b has a drain connected to a line of the read signal RD, a gate connected to a line of the selection signal Sel_B, and a source connected to a drain of the transistor 61c.

With the above configuration, in the event that a bit line connected to the PB control circuit 60 is defective, the defect signal nPB_Defect has a low level. In this case, since the transistor 61c is turned off, a transfer path between the read signal RD and ECC Bus_1 is blocked. For this reason, read data Data_Out_B is fixed to a high level through a pull-up circuit. Meanwhile, in the event that a bit line connected to the PB control circuit 60 is not defective, the defect signal nPB_Defect has a low level. In this case, the transistor 61c is always turned on. By this, the read signal RD, that is, data of a memory cell transistor is output onto ECC Bus_1 such that it is read as read data Data_Out_B.

As compared with a data fixing unit 90b, the data fixing unit 90b' has such a merit that an AND circuit is not required because the transistors 61b and 61c are respectively connected in series between a line of the read signal RD and ECC Bus_1.

In the data fixing unit 90b' illustrated in FIG. 5, if the transistor 61c is inserted between a line of the read signal RD and drains of the transistors 61a and 61b, that is, between a line of the read signal RD and the PB control circuit 60, the PB control circuit 60 acts as a data fixing circuit that outputs to Data Bus_1 a fixed level (high level) of read data Data_Out_A in response to the selection signal Sel_A provided at the normal mode and a high level of read data Data_Out_B in response to the selection signal Sel_B provided at the ECC mode.

As described above, in the event that a bit line connected to the PB control circuit 60 is defective, data Data_Out_A or Data_Out_B may be fixed to a low level or a high level.

The write unit of the PB control circuit 60, as illustrated in FIG. 4, comprises inverter circuits 62, 63, 67, NAND circuits 64 and 65, an OR circuit 66, switches 68 and 69, and an AND circuit 71. The inverter circuit 62 is a logical inversion circuit and has an output terminal connected to a line of the write signal DI and an input terminal connected to an output terminal of the NAND circuit 64. The inverter circuit 63 is a logical inversion circuit and has an output terminal connected to a line of the write signal nDI and an input terminal connected to an output terminal of the NAND circuit 65.

The NAND circuit 64 is a 3-input 1-output NAND circuit and has a first input terminal connected to a line of a write enable signal fDinEnable, a second input terminal connected to an output terminal of the OR circuit 66, and a third input terminal connected to an output terminal of the inverter circuit 67. An output terminal of the NAND circuit 64 is connected to an input terminal of the inverter circuit 62. The NAND circuit 65 is a 3-input 1-output NAND circuit and has a first input terminal connected to a line of the write enable signal fDinEnable, a second input terminal connected to the output terminal of the OR circuit 66, and a third input terminal connected to a first input/output terminal of the switch 68 and a first input/output terminal of the switch 69. An output terminal of the NAND circuit 65 is connected to an input terminal of the inverter circuit 63.

The OR circuit 66 is a 2-input 1-output logic circuit and has a first input terminal connected to an output terminal of the AND circuit 71 and a second input terminal connected to a line of the selection signal Sel_A. An output terminal of the OR circuit 66 is connected to the second input terminal of the NAND circuit 64 and the second input terminal of the NAND circuit 65. The AND circuit 71 logically combines the selection signal Sel_B and the defect signal nPB_Defect. In case the defect signal nPB_Defect has a high level (in case a defect is not generated), the selection signal Sel_B has a high level; therefore, the second input terminal of the NAND circuit 65 has a high level. This means that a write condition is satisfied. Meanwhile, if the defect signal nPB_Defect has a low level (defective page buffer), the second input terminal of the NAND circuit 65 is not set to a high level in an operation mode of the selection signal Sel_B. Thus, writing is not made.

The inverter circuit 67 is a logical inversion circuit and has an input terminal connected to the first input/output terminal of the switch 68 and the first input/output terminal of the switch 69 and an output terminal connected to the third input terminal of the NAND gate 64.

The switch 68 is a bidirectional switch and has the first input/output terminal connected to the input terminal of the inverter circuit 67 and the third input terminal of the NAND circuit 65 and a second input/output terminal connected to Data Bus. The switch 69 is a bidirectional switch and has the first input/output terminal connected to the input terminal of the inverter circuit 67 and the third input terminal of the NAND circuit 65 and a second input/output terminal connected to ECC Bus. In addition, an input of the inverter circuit 67 is pulled up by a PMOS transistor such that an input of the inverter circuit 67 is not set to a "don't care" state when any one of the bidirectional switches is unselected.

With the above-described structure, when the write enable signal fDinEnable is at a high level and the selection signal Sel_B is at a high level at a data write operation of the ECC mode (first operation mode), the write unit of the PB control circuit 60 turns on the switch 69 such that one of the write signals DI and nDI transitions from a low level to a high level in response to a level of the data-in signal Data_In_B received from ECC Bus. In detail, when the data-in signal Data_In_B is at a low level (data 0), the write signal DI transitions to a high level. By this, Data_i of one of the bit inner circuits 50_0 to 50_7 goes to a low level. Afterwards, data 0 is written at a memory cell transistor through a program operation.

Meanwhile, when the data-in signal Data_In_B is at a high level (data 1), the write signal nDI transitions to a high level. By this, Data_i of one of the bit inner circuits 50_0 to 50_7 goes to a high level. Afterwards, data 1 is written at a memory cell transistor through a program operation.

If the write enable signal fDinEnable and the selection signal Sel_A have a high level at a data write operation of a normal mode (second operation mode), the write unit of the PB control circuit 60 turns on the switch 68 such that one of the write signals DI and nDI transitions from a low level to a high level in response to a level of the data-in signal Data_In_A received from Data Bus. In detail, when the data-in signal Data_In_A is at a low level (data 0), the write signal DI transitions to a high level. By this, Data_i of one of the bit inner circuits 50_0 to 50_7 goes to a low level. Afterwards, data 0 is written at a memory cell transistor through a program operation.

Meanwhile, when the data-in signal Data_In_A is at a high level (data 1), the write signal nDI transitions to a high level. By this, Data_i of one of the bit inner circuits 50_0 to 50_7 goes to a high level. Afterwards, data 1 is written at a memory cell transistor through a program operation.

As described above, the PB control circuit 60 is a circuit that controls a data transfer between a data bus (first data bus and second data bus) and a memory cell transistor connected through a bit line to one, selected by the selection signal DIO<i>, from among the bit inner circuits 50_0 to 50_7 constituting a PB unit of a page buffer 102.

Also, the line of the read signal RD, the line of the write signal DI, and the line (IO line) of the write signal nDI are lines connecting the PB control circuit 60 and the bit inner circuits 50_0 to 50_7 constituting the PB unit and are input/output lines to perform a data transfer of the PB unit. In exemplary embodiments, the PB control circuit 60 transfers write data and read data between an input/output unit of the page buffer 102 and the first and second data buses (ECC Bus and Data Bus).

Returning to FIG. 3A, an operation of a PB 4IO unit 30_0 according to the above-described configuration of the PB control circuit 60 will be described. When a high level of selection signal Sel_A<0> is received from the column coding circuit 103, the PB 4IO unit 30_0 connects input/output lines IO_0 to IO_3 of four page buffers to a 4-bit data bus Data_A<3:0>. By this, the PB 4IO unit 30_0 outputs the data-out signals Data_Out_A<0> to Data_Out_A<3> (hereinafter, referred to as data-out signals Data_Out_A<3:0>) to the Data_Out_A<0> on the data bus Data_A<3:0>.

When a high level of selection signal Sel_B<0> is received from the ECC column coding circuit 108, the PB 4IO unit 30_0 connects input/output lines IO_0 to IO_3 of four page buffers to a 4-bit ECC Bus Data_B<3:0> (here, referred to as data bus Data_B<3:0>). By this, the PB 4IO unit 30_0 outputs the data-out signals Data_Out_B<0> to Data_Out_B<3> (hereinafter, referred to as data-out signals Data_Out_B<3:0>) to the data bus Data_Out_B<0> on the data bus Data_B<3:0>.

Returning to FIG. 2, at a data read operation, a page buffer 102, a column coding circuit 103, and an ECC column coding circuit 108 (here, referred to as a data read module) operate as follows according to the above-described configuration of the PB 4IO unit 30_0.

Also, input/output lines (data read lines RD illustrated in FIGS. 4 and 5) of page buffers connected to PB 4IO units 30_1 to 30_9 illustrated in FIG. 2 are referred to as IO lines IO_4 to IO_7, IO lines IO_8 to IO_11, IO lines IO_12 to IO_15, IO lines IO_16 to IO_19, IO lines IO_20 to IO_23, IO lines IO_24 to IO_27, IO lines IO_28 to IO_31, IO lines IO_32 to IO_35, and IO lines IO_36 to IO_39, respectively.

Also, the Data Bus is an 8-bit-wide bus and is referred to as a data bus Data_A<7:0>. The ECC Bus has a 20-bit-wide bus and is referred to as a data bus Data_B<19:0>.

At the normal mode (second operation mode), the column coding circuit 103 sets one of column addresses of selection signals Sel_A<0> to Sel_A<4> to a high level and the rest thereof to a low level to output the selection signals Sel_A<0> to Sel_A<4> thus set to the data read module. For example, at the normal mode, 40-bit data of the IO lines IO_0 to IO_39 is sequentially output onto the data bus Data_A<7:0> by sequentially providing the selection signals Sel_A<0> to Sel_A<4> to the data read module.

When the selection signal Sel_A<0> goes to a high level, the transistor 61a of the PB control circuit 60 is turned on. At this time, the PB 4IO unit 30_0 and the PB 4IO unit 30_1 connect the IO lines IO_0 to IO_7 to the data bus Data_A<7:0>. By this, the PB 4IO unit 30_0 and the PB 4IO unit 30_1 output data-out signals Data_Out_A<7:0> (data on the IO lines IO_0 to IO_7) to the data bus Data_A<7:0>.

Then, the transistor 61a of the PB control circuit 60 is turned on when the selection Sel_A<1> goes to a high level. At this time, the PB 4IO unit 30_2 and the PB 4IO unit 30_3 connect the IO lines IO_8 to IO_15 to the data bus Data_A<7:0>. By this, the PB 4IO unit 30_2 and the PB 4IO unit 30_3 output data-out signals Data_Out_A<7:0> (data on the IO lines IO_8 to IO_15) to the data bus Data_A<7:0>.

When the selection Sel_A<2> goes to a high level, the transistor 61a of the PB control circuit 60 is turned on. At this time, the PB 4IO unit 30_4 and the PB 4IO unit 30_5 connect the IO lines IO_16 to IO_23 to the data bus Data_A<7:0>. By this, the PB 4IO unit 30_4 and the PB 4IO unit 30_5 output data-out signals Data_Out_A<7:0> (data on the IO lines IO_16 to IO_23) to the data bus Data_A<7:0>.

The transistor 61a of the PB control circuit 60 is turned on when the selection Sel_A<3> goes to a high level. At this time, the PB 4IO unit 30_6 and the PB 4IO unit 30_7 connect the IO lines IO_24 to IO_31 to the data bus Data_A<7:0>. By this, the PB 4IO unit 30_6 and the PB 4IO unit 30_7 output data-out signals Data_Out_A<7:0> (data on the IO lines IO_24 to IO_31) to the data bus Data_A<7:0>.

Finally, when the selection Sel_A<4> goes to a high level, the transistor 61a of the PB control circuit 60 is turned on. At this time, the PB 4IO unit 30_8 and the PB 4IO unit 30_9 connect the IO lines IO_32 to IO_39 to the data bus Data_A<7:0>. By this, the PB 4IO unit 30_8 and the PB 4IO unit 30_9 output data-out signals Data_Out_A<7:0> (data on the IO lines IO_32 to IO_39) to the data bus Data_A<7:0>.

As described above, if the selection signal Sel_A is provided to the data read module five times, the PB 4IO units 30_0 to 30_9 connect the IO lines IO_0 to IO_39 to the data bus Data_A<7:0> by the 8-IO unit. By this, 40-bit data stored in memory cell transistors are read on the data bus through bit lines and IO lines IO_0 to IO_39.

At the ECC mode (first operation mode), the ECC column coding circuit 108 sets one of column addresses of the selection signals Sel_B<O> and Sel_B<1> to a high level and the other to a low level and outputs them to the data read module.

For example, at the ECC mode, 40-bit data of the IO lines IO_0 to IO_39 is sequentially read onto a data bus Data_B<19:0> by sequentially providing the selection signals Sel_B<0> and Sel_B<1> to the data read module.

When the selection Sel_B<0> goes to a high level, the transistor 61b of the PB control circuit 60 is turned on. At this time, the PB 4IO units 30_0, 30_2, 30_4, 30_6, and 30_8 connect the data bus Data_B<19:0> to IO lines IO_0 to IO_3, IO_8 to IO_11, IO_16 to IO_19, IO_24 to IO_27, and IO_32 to IO_35. By this, the PB 4IO units 30_0, 30_2, 30_4, 30_6, and 30_8 output data-out signals Data_Out_B<19:0> (data on the IO lines IO_0 to IO_3, IO_8 to IO_11, IO_16 to IO_19, IO_24 to IO_27, and IO_32 to IO_35) to the data bus Data_B<19:0>.

When the selection Sel_B<1> goes to a high level, the transistor 61a of the PB control circuit 60 is turned on. At this time, the PB 4IO units 30_1, 30_3, 30_5, 30_7, and 30_9 connect the data bus Data_B<19:0> to IO lines IO_4 to IO_7, IO_12 to IO_15, IO_20 to IO_23, IO_28 to IO_31, and IO_36 to IO_39. By this, the PB 4IO units 30_1, 30_3, 30_5, 30_7, and 30_9 output data-out signals Data_Out_B<19:0> (data on the IO lines IO_4 to IO_7, IO_12 to IO_15, IO_20 to IO_23, IO_28 to IO_31, and IO_36 to IO_39) to the data bus Data_B<19:0>.

As described above, if the selection signal Sel_B is provided to the data read module two times, the PB 4IO units 30_0 to 30_9 connect the IO lines IO_0 to IO_39 to the data bus Data_B<19:0> by the 20-IO unit. By this, 40-bit data stored in memory cell transistors are read on the ECC Bus through bit lines and IO lines IO_0 to IO_39.

For example, when a selection signal is not provided five times at the normal mode, data on IO lines IO_0 to IO_3, IO_8 to IO_11, IO_16 to IO_19, IO_24 to IO_27, and IO_32 to IO_35 is not read on the data bus. If a selection signal (Sel_B<0>) is provided once at the ECC mode, data of the IO lines IO_0 to IO_3, IO_8 to IO_11, IO_16 to IO_19, IO_24 to IO_27, and IO_32 to IO_35 may be read out on the ECC Bus.

Figure 7:
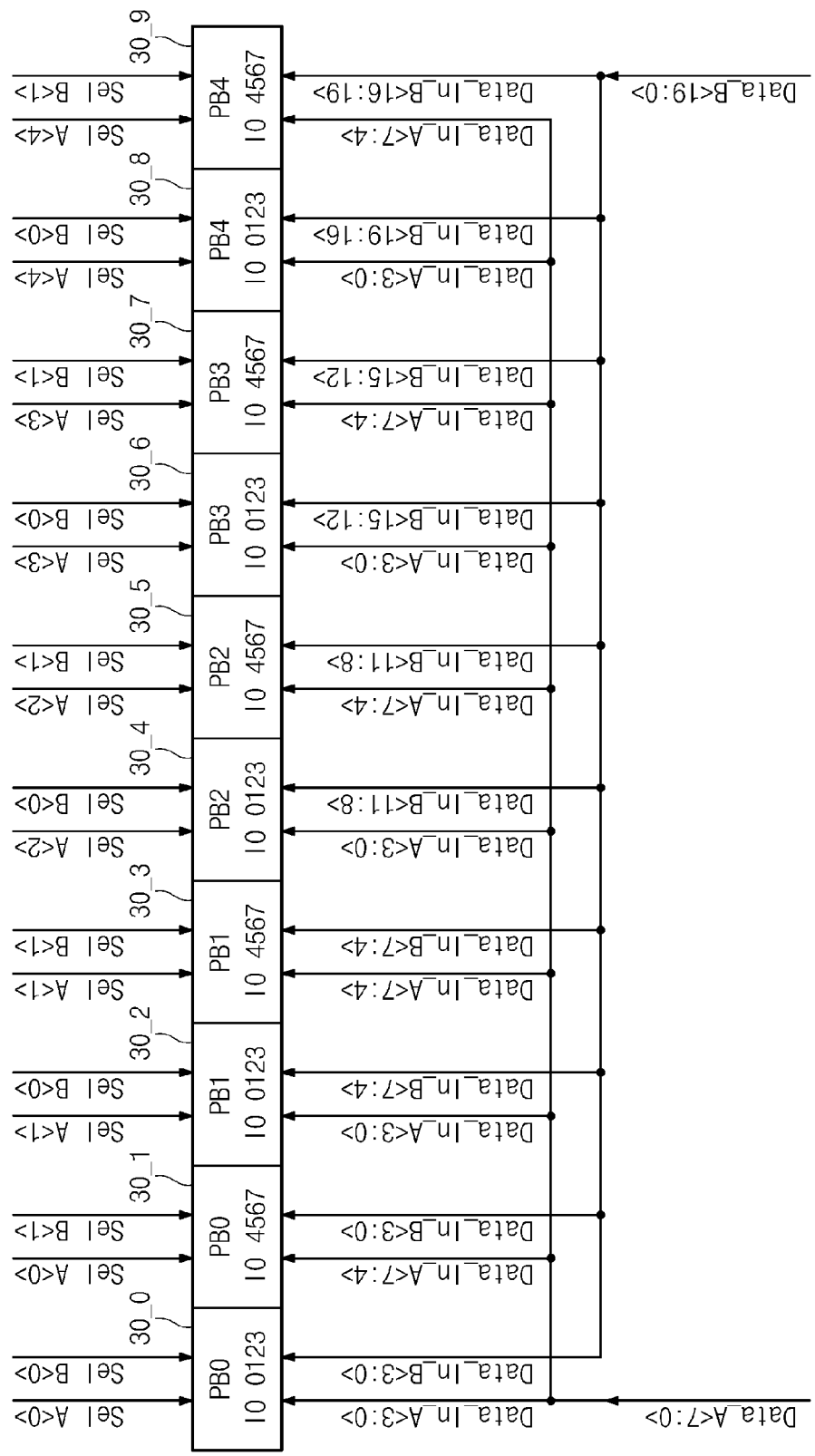
FIG. 7 is a diagram illustrating a data write operation of a portion corresponding to a page buffer, a column coding circuit, and an ECC column coding circuit illustrated in FIG. 1.

FIG. 7 is a diagram illustrating a data write operation of a portion corresponding to a page buffer 102, a column coding circuit 103, and an ECC column coding circuit 108 illustrated in FIG. 1. A data write operation of a page buffer 102, a column coding circuit 103, and an ECC column coding circuit 108 (referred to as a data write module) is performed by an operation of a PB 4IO unit 30_0.

In the data write module, a data transfer is performed in a direction opposite to a direction described with reference to FIG. 2, and a description thereof is thus omitted.

In the data write module, for example, at a normal mode, data to be applied to IO lines IO_0 to IO_3, IO_8 to IO_11, IO_16 to IO_19, IO_24 to IO_27, and IO_32 to IO_35 is not written on Data Bus if a selection signal is not provided five times. In contrast, if a selection signal (Sel_B<O>) is provided once at the ECC mode, data to be applied to the IO lines IO_0 to IO_3, IO_8 to IO_11, IO_16 to IO_19, IO_24 to IO_27, and IO_32 to IO_35 is written on the ECC bus.

A NAND flash device (semiconductor memory device) 10 of the inventive concepts comprises a first data bus Data_B<19:0>, a second data bus Data_A<7:0> being different in number from the first data bus and independent from the first data bus Data_B<19:0>, and a data transfer unit (PB control circuit 60 of each of PB 4IO units 30_0 to 30_9). When a data transfer with memory cells is performed at the first operation mode, the data transfer unit connects bit lines, being equal in number to the first data bus, from among a plurality of bit lines to the first data bus to transfer data. When a data transfer with memory cells is performed at the second operation mode, the data transfer unit connects bit lines, being equal in number to the second data bus, from among a plurality of bit lines to the second data bus to transfer data.

If the number of bit lines is n (n being a common multiple of p and q being a natural number, p>q), the first data bus is q and the second data bus is q. If (n/p) address signals are received at the first operation mode, the data transfer unit connects p bit lines to "p" lines of the first data bus. If (n/q) address signals are received at the second operation mode, the data transfer unit connects q bit lines to the second data bus.

Also, the NAND flash memory 10 comprises a memory array 101, a page buffer 82 configured to read data from the memory array 101 by the page and store read data read from the memory array 101, an ECC circuit 107 configured to correct an error on the read data transferred from the page buffer 82 and write the error-corrected data back in the page buffer 82, and an IO pad (interface unit) 106 configured to output the read data written back in the page buffer 82. ECC Bus is connected to the ECC circuit 107, and Data Bus is connected to the IO pad 106.

In the NAND flash memory 10, the page buffer 82 stores write data received through the IO pad 106, and the ECC circuit 107 generates parity data on the write data transferred from the page buffer 82. The parity data and write data are written back in the page buffer.

By this, it is possible to control column coding, that is, addresses independently from the page buffer 102 by preparing a plurality of data buses (ECC Bus and Data Bus in an embodiment of the inventive concept).

In exemplary embodiments, it is possible to control addresses independently by forming a data bus to be independent from input/output lines of the page buffer 102 (IO_0 to IO_39), that is, a portion directly connected to the page buffer. Thus, the semiconductor memory device according to an embodiment of the inventive concepts obtains the following effects.

(1) A high-speed operation is implemented by widening a bus width at the first operation mode (ECC mode in the inventive concept). There is described an example where when a column address is received once, 8-bit data is transferred to Data Bus at the second operation mode (normal mode) and 20-bit data is transferred at the ECC mode. A bus width is easily widened according to an input of Address_B (input of Sel_B to PB control circuit 60), that is, column coding to the page buffer 102. For example, if two column addresses are used for 1024 PB units, it is possible to transfer data with the ECC Bus being widened a 512-bit-wide bus at the ECC mode.

Also, it is possible to form a data bus independent from a portion directly connected to the page buffer and to control addresses independently. For this reason, as compared with the case that data is transferred to an ECC circuit using a part of the data bus, a high-speed data transfer is implemented.

In particular, since the PB control circuit 60 transfers fixed data to the ECC circuit 107 via ECC Bus with respect to a defective PB unit, it is unnecessary to transfer ECC-processed data to the column repair circuit 104 and the ECC circuit 107 via ECC Bus. Also, it is unnecessary to dispose the column repair circuit 104 on a path of ECC Bus with a widened bus width. A time taken to transfer data from a page buffer to an ECC circuit at ECC processing is shortened as long as a time taken for the column repair circuit 104 to perform a repair operation. Also, it is unnecessary to widen a bus width of Data Bus (second data bus) at ECC processing; therefore, an increase in the size of the column repair circuit 104 is prevented.

(2) Address control and freedom on address mapping are improved. At a normal mode, when 8-bit data is transferred using a column address, for example, data of IO lines IO_0 to IO_7 is transferred to Data Bus by providing a selection signal Sel_A<0> to PB 4IO units 30_0 and 30_1. In this behalf, at an ECC mode, data on all addresses is transferred to the ECC circuit in a lump by allocating an address independent from the selection signals Sel_B<0> and Sel_B<1> to the PB 4IO units 30_0 and 30_1. For example, although different addresses are assigned to the selection signal Sel_A at a normal mode, the same address as the selection signal Sel_B is assigned to normal data and parity data at the ECC mode; therefore, normal data and parity data are transferred to the ECC circuit in a lump. This means that address control at the second operation mode and address control at the first operation mode are independent from each other and freedom of address mapping is high.

Also, at the normal mode, a column address is used to generate five selection signals Sel_A<0> to Sel_A<4>. At the ECC mode, a column address is used to generate two selection signals Sel_B<0> and Sel_B<1>. This means that although a column address has a value not being $2^n$ in case of the user specification of the normal mode, it is easy to change an address space of the ECC mode to a unit space having a value of $2^n$.

Thus, a code configuration of the ECC circuit 107, for example, a code length may be decided with freedom on optimization on code length composition in case of cumulative coding and how long a code length is, so that performance is optimized.

(3) A design change is easily made.

In case of designing a product including an ECC circuit, it is assumed that a product is a derivation product and a product not including an ECC circuit is separately designed. In this case, data buses and column coding circuits associated with address control are independent at the ECC mode and the normal mode. By this, it is possible to separate a circuit associated with the ECC mode and a circuit associated with the normal mode. Thus, it is easy to eliminate the circuit associated with the ECC mode. This means that a design change is easily made.

Figure 8A:
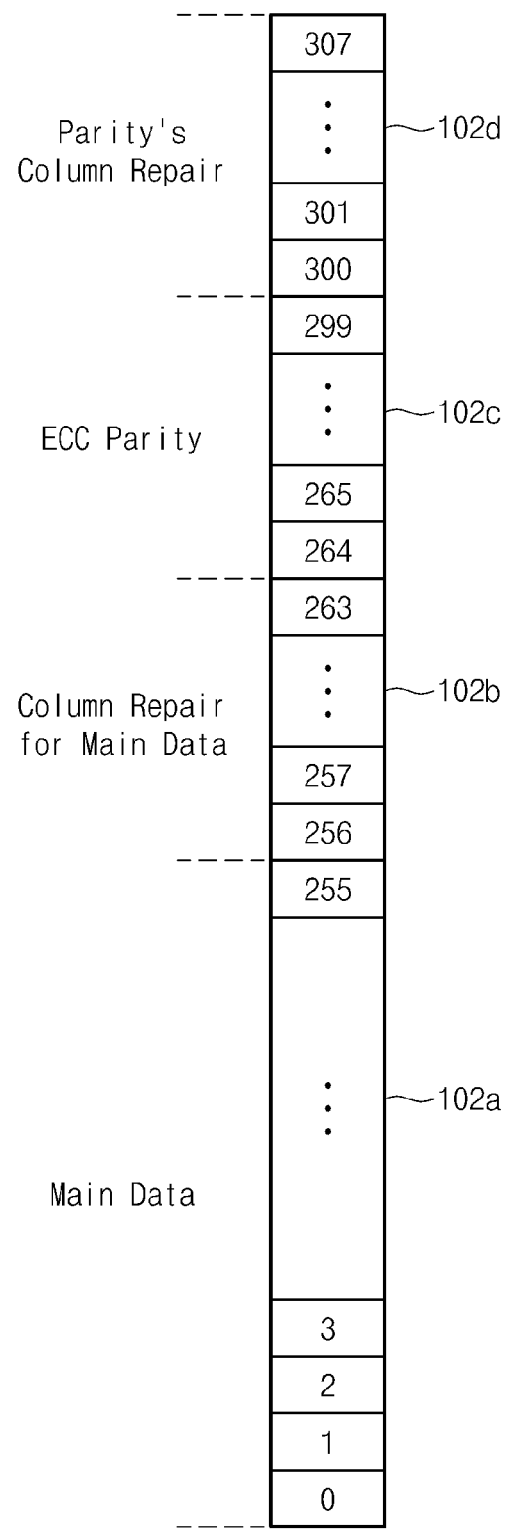
FIGS. 8A-8C are diagrams illustrating each page buffer of a page buffer.
Figure 8B:
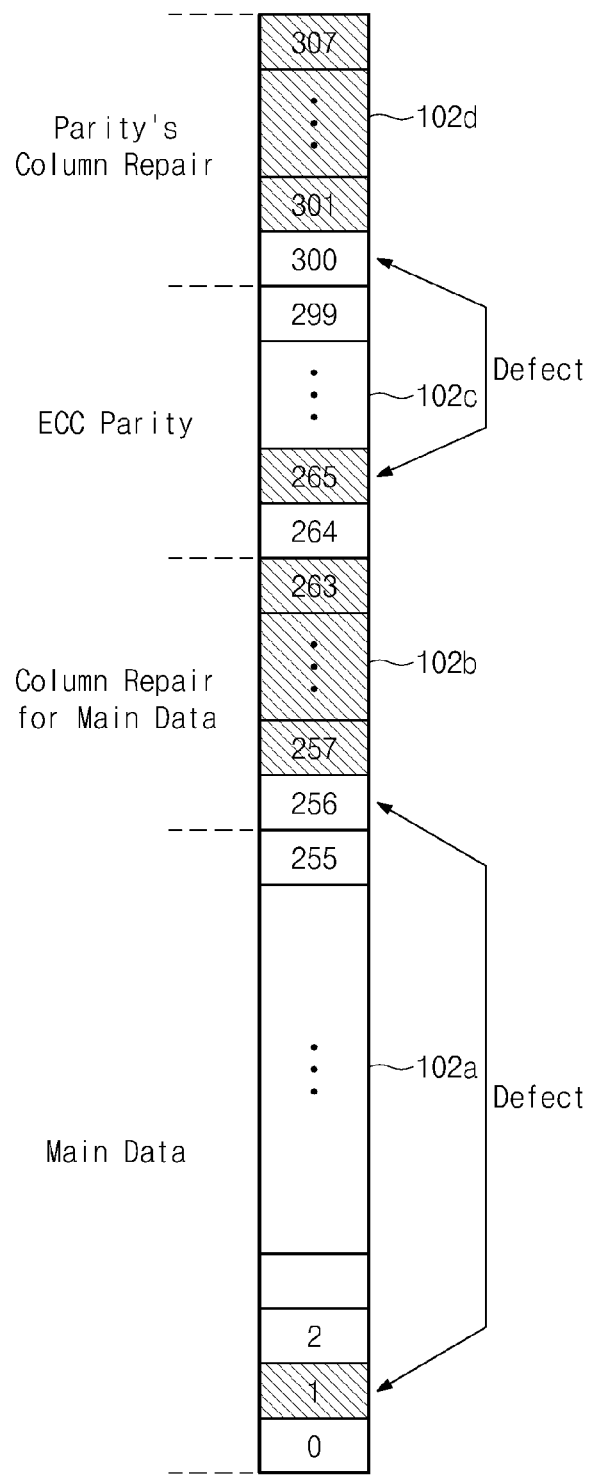
Figure 8C:
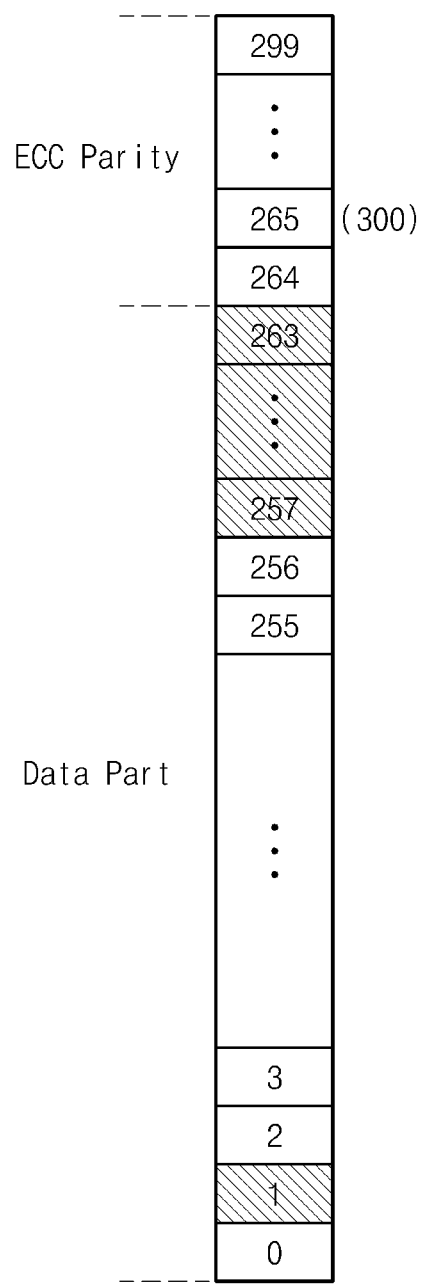

Now will be described operations of a first operation mode and a second operation mode of a NAND flash memory illustrated in FIG. 1 with reference to a configuration of a page buffer 102 and an operation flow chart. FIGS. 8A-8C are diagrams illustrating each page buffer of a page buffer 102. FIGS. 9A-9D are flow charts illustrating an operation of a page buffer 102.

In FIG. 8A, there are schematically illustrated a page buffer 120a corresponding to main data (normal data), a page buffer 102b to perform column repair of main data (repair data of normal data), a page buffer 102c corresponding to ECC parity (parity data), and a page buffer 102d to perform parity's column repair (repair data of parity data). In FIG. 8A, numbers indicate PB units (unit formed of PB control circuit 60 and bit inner circuits 50_0 to 50_7 illustrated in FIGS. 4 and 5) constituting the page buffers 102a to 102d. The numbers are numbers of selection signals Sel_A indicating locations of PB units, that is, Coding illustrated in FIG. 3B.

That is, the page buffer 102a includes 256 PB units 0 to 255 corresponding to normal data, the page buffer 102b includes 8 PB units 256 to 263 to perform repair of normal data, the page buffer 102c includes 36 PB units 264 to 299 corresponding to parity data, and the page buffer 102d includes 8 PB units 300 to 307 to perform repair of parity data.

In FIG. 8B, there is illustrated an example in which when eight bit lines connected to a PB unit 1 of the page buffer 102a or memory cell transistors connected to eight bit lines are defective, the PB unit 1 of the page buffer 102a is replaced with a PB unit 256 of the page buffer 102b. Also, in FIG. 8B, there is illustrated an example in which when eight bit lines connected to a PB unit 265 of the page buffer 102c or memory cell transistors connected to eight bit lines are defective, the PB unit 265 of the page buffer 102c is replaced with a PB unit 300 of the page buffer 102d.

In addition, PB units 257 to 263 of the page buffer 102b corresponding to a slashed portion in FIG. 8B are unused PB units, so that the PB units 257 to 263 are not selected by a column coding circuit 103 under a control of a column repair circuit 104. That is, the PB units 257 to 263 may be at an inactive state. PB units 301 to 307 of the page buffer 102*d* corresponding to a slashed portion in FIG. 8B are unused PB units, so that the PB units 301 to 307 are not selected by an ECC column coding circuit 108 under a control of a parity column repair circuit 105. That is, the PB units 301 to 307 may be at an inactive state.

At a normal mode, since the PB unit 1 of the page buffer 102*a* is not selected and the PB unit 256 replaced is selected by a selection signal Sel_A, a data-out signal Data_Out_A (data read from the PB unit 1) is output to an I/O pad 106 through Data Bus_1, Data Bus_2, and Data Bus_3 (second data bus). If write data is received from the I/O pad 106 at the normal mode, it is provided to the PB unit 256 through Data Bus_3, Data Bus_2, and Data Bus_1 as the a data-in signal Data_A_In (data to be stored in the PB unit 1). As described above, a region of a page buffer where a user may provide a column address is from the PB unit 0 to the PB unit 255. That is, the PB unit 256 to 263 of the page buffer 102*b*, the PB units 264 to 299 of the page buffer 102*c*, and the PB units 300 to 307 of the page buffer 102*d* form a page buffer region that is inaccessible by a user.

Also, the PB unit 1 of the page buffer 102*a* is selected by a selection signal Sel_B at an ECC mode, and a data-out signal Data_Out_B fixed to a low level or a high level is transferred to an ECC circuit 107 through ECC Bus_1 and ECC Bus_2 (first data bus) so as to be used to perform ECC processing. Also, the repaired PB unit 256 is selected by the selection signal Sel_B, and a data-out signal Data_Out_B is transferred to the ECC circuit 107 through ECC Bus_1, ECC Bus_2, and ECC Bus_3 so as to be used to perform ECC processing as read data of the PB unit 1 seen from the user.

At the ECC mode, if the ECC processing is ended, data to be written back at the PB unit 1 is provided to the PB unit 256 through ECC Bus_3, ECC Bus_2, and ECC Bus_1 (first data bus) as a data-in signal Data_A_In. In addition, data, corresponding to PB units 0 to 255, from among ECC-processed data may be provided to the external device as clear data through a data bus Data_A.

When the PB unit 265 of the page buffer 102*c* is selected by the selection signal Sel_B at the ECC mode, a data-out signal Data_Out_B fixed to a low level or a high level is transferred to a parity column repair circuit 105 through ECC Bus_1 and ECC Bus_2 (data bus Data_B). Also, as the repaired PB unit 300 is selected by the selection signal Sel_B, a data-out signal Data_Out_B is transferred to the parity column repair circuit 105 through ECC Bus_1 and ECC Bus_2 to perform repair processing. Thus, data from the PB unit 300 is transferred to the ECC circuit 107 via ECC Bus_3 as a data-out signal of the PB unit 265 so as to be used to perform ECC processing.

At the ECC mode, if the ECC processing is ended, data to be written back at the PB unit 265 is provided to the parity column repair circuit 105 through ECC Bus_3 to perform repair processing, and resultant data is then provided to the PB unit 300 through ECC Bus_2 and ECC Bus_1 (first data bus) as a data-in signal Data_A_In. In addition, ECC-processed data is not output to the external device through the data bus Data_A as described above.

Figure 9A:
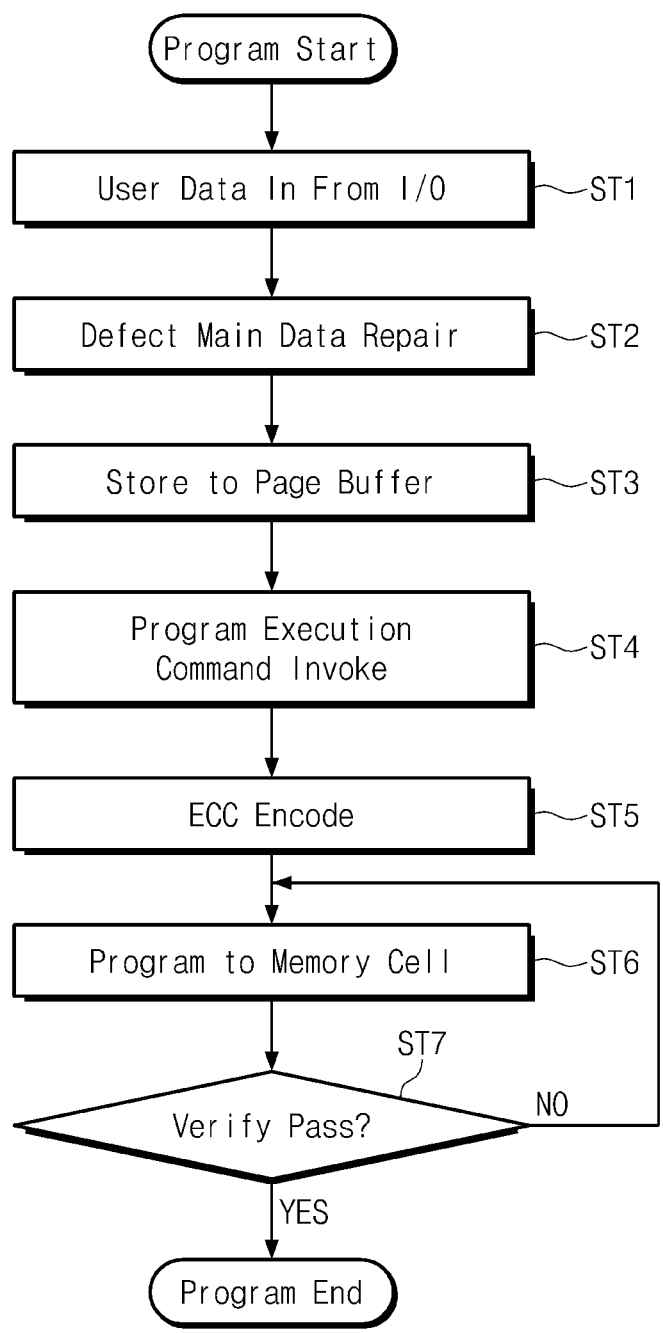
FIGS. 9A-9D are flow charts illustrating an operation of a page buffer.
Figure 9B:
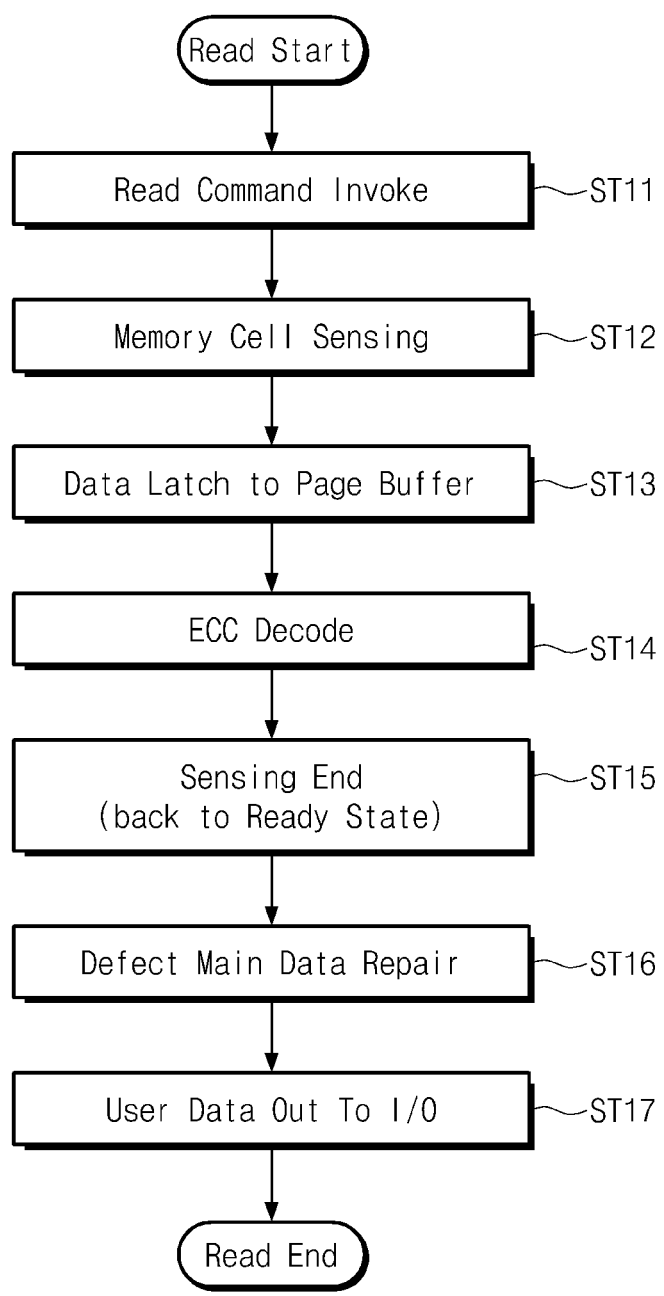
Figure 9C:
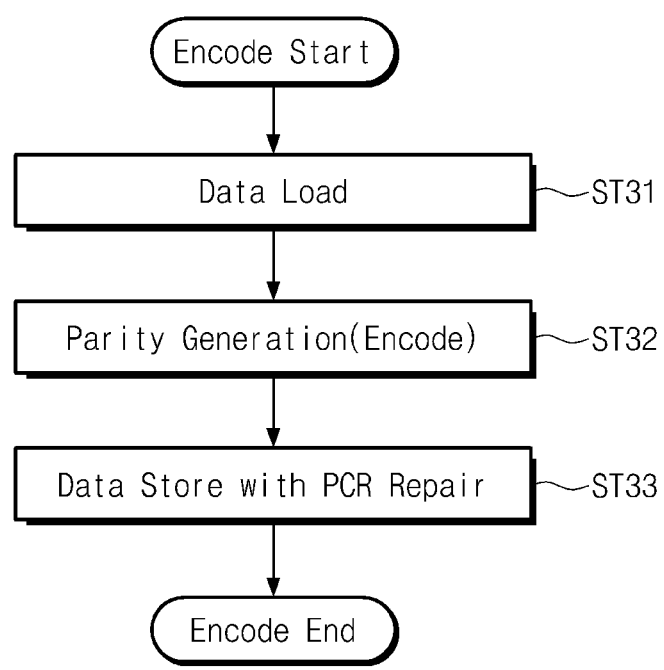
Figure 9D:
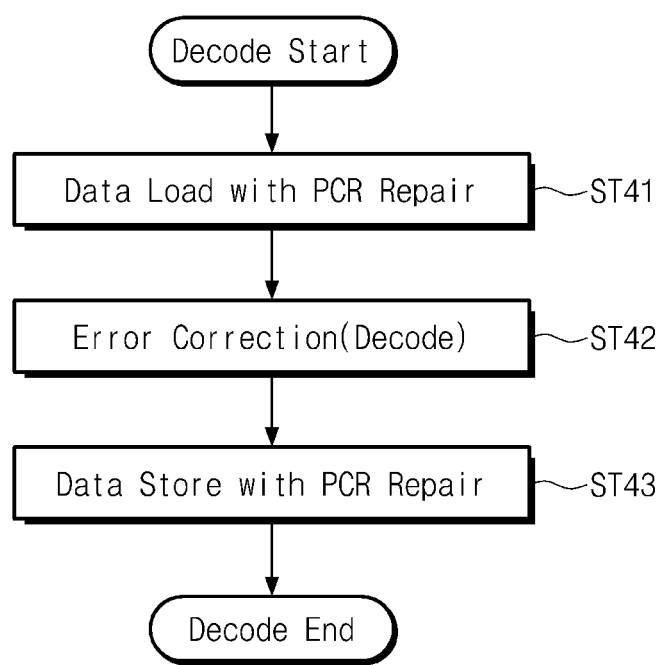

A data write operation to a memory cell transistor and a data read operation from a memory cell transistor are described with reference to FIGS. 9A-9D. FIG. 9A illustrates a data write operation, FIG. 9B illustrates a data read operation, FIG. 9C illustrates an ECC encoding operation, and FIG. 9D illustrates an ECC decoding operation.

[Data Write Operation]

In step ST1, a user provides a NAND flash memory 10 with a predetermined command (write command), an address (here, column address selecting a PB unit 1), and write data through an I/O pad 106.

In step ST2, a repair of normal data is executed. In detail, a column coding circuit 103 selects a PB unit 256 instead of a PB unit 1 under a control of a column repair circuit 104 such that the write data is stored in the PB unit 256.

After a time elapses, the method proceeds step ST6 when a mode is a normal mode (second operation mode) where the user invokes a program execution command (ST5). In step ST6, programming is executed such that data is transferred to a memory cell transistor from a page buffer through a bit line. In case of an ECC mode (first operation mode), the method proceeds to step ST5 to execute an ECC encoding operation as follows.

Here, FIG. 8C illustrates a code structure at ECC processing. As ECC, a data unit is data stored in PB units 0 to 263, and a parity unit (ECC parity) is data stored in PB units 264 to 299. Data to be written in the PB unit 1 is stored in the PB unit 256, and data stored in memory cell transistors are read and stored in PB units 0 and 2 to 255 through bit lines connected thereto.

In step ST31, data stored in the PB units 0 to 263 is provided to an ECC circuit 107 through ECC Bus_1, ECC Bus_2, and ECC Bus_3 (first data bus) (Data Load).

As described above, at this time, fixed data (L data in case of a PB control circuit 60 illustrated in FIG. 4 or H data in case of a PB control circuit 60 illustrated in FIG. 5) is provided from the PB unit 1 to the ECC circuit 107. Data that is data to be written in the PB unit 1 but data written in the PB unit 256 is provided to the ECC circuit 107 from the PB unit 256.

The ECC circuit 107 generates parity data through an encoding operation (ST32).

The ECC circuit 107 stores ECC-processed data in the PB units 0 to 299 (ST33). At this time, an ECC coding circuit 108 selects a PB unit 300 instead of a PB unit 265 under a control of a parity column repair circuit 105. By this, parity data to be written back in the PB unit 265 is again stored in the PB unit 300. At encoding, data is not written back to the PB units 0 to 263. However, the same data may be written back.

Parity data is written at PB units 264 to 307. A write operation on a page buffer having an inactive state as a slashed portion in FIG. 8B is prevented by a circuit illustrated in FIG. 4 or 5.

Since data Data_i to be written at a memory cell is latched by a latch unit of each PB unit (refer to FIG. 6), a memory cell transistor is programmed (ST6). Data is iteratively provided to a memory cell from a latch unit of each PB unit until a program operation is passed (ST7). If the program operation is passed, the iterative process is ended (ST7—Yes). If the program operation is not passed, the procedure goes to step ST6 to perform a program operation until the program operation is passed (ST7—No).

[Data Read Operation]

A user provides a predetermined command (read command) and an address (column address selecting the PB unit 1) (ST11).

Data of a memory cell transistor is sensed by a latch unit of each PB unit, and the sensed data is latched on a connection node N1 of a bit inner circuit illustrate in FIG. 6 (ST12).

Data_i is latched by the latch unit of the bit inner circuit (ST13). In case of a normal mode (second operation mode), the procedure goes to step ST15 to end a sensing operation.

In case of an ECC mode (first operation mode), the procedure goes to step ST14 to perform an ECC decoding operation as follows.

In step S41, data stored in PB units 0 to 299 is provided to the ECC circuit 107 through ECC Bus_1, ECC Bus_2, and ECC Bus_3 (first data bus) (Data Load). At this time, fixed data (L data in case of a PB control circuit 60 illustrated in FIG. 4 or H data in case of a PB control circuit 60 illustrated in FIG. 5) is provided from the PB unit 1 to the ECC circuit 107 as described above. Also, data that is data to be written in the PB unit 1 but data actually written in the PB unit 256 is provided to the ECC circuit 107 from the PB unit 256. Also, parity data that is data to be written in the PB unit 265 but actually data written in the PB unit 300 is provided to the parity column repair circuit 105 from the PB unit 300 through ECC Bus_1 and ECC Bus_2. After a repair operation, resultant data is provided to the ECC circuit 107 through ECC Bus_3.

The ECC circuit 107 performs a decoding operation to correct an error of data stored in the PB units 0 to 263 based on parity data (ST42).

The ECC circuit 107 stores ECC-processed data in the PB units 0 to 299 (ST43). ECC-processed data (error-corrected data) is stored in the PB units 0 to 263. Since parity data units of PB units 264 to 307 are not used by the user, ECC-processed data (error-corrected data) is not stored in the PB units 264 to 307. However, it is possible to store ECC-processed data (error-corrected data) in the PB units 264 to 307. The PB unit 300 is selected instead of the PB unit 265 under a control of the parity column repair circuit 105. By this, error-corrected parity data to be written back in the PB unit 265 is stored in the PB unit 300. A write operation on a page buffer having an inactive state as a slashed portion in FIG. 8B is inhibited by a circuit illustrated in FIG. 4 or 5.

Since data Data_i to be written at a memory cell is latched by a latch unit of each PB unit illustrated in FIG. 6, a sensing operation is ended, and a memory enters a readable state (ST15).

As a selection signal Sel_A is provided to the PB units 0 to 255, data stored therein is read through Data Bus_1, Data Bus_2, and Data Bus_3. At this time, a column coding circuit 103 selects the PB unit 256 instead of the PB unit 1 under a control of the column repair circuit 104. The PB unit 256 outputs data that is data to be written at the PB unit 1 but data actually written at the PB unit 256. That is, a defect column is repaired (ST16). As described above, data written at memory cell transistors through the PB unit 1 according to a user's request is written at other memory cells after repairing. Also, an error of the written data is corrected, and the error-corrected data is output from the I/O pad 106 (ST17).

A NAND flash memory 10 (semiconductor memory device) comprises ECC Bus_1 to ECC Bus_3 (first data bus), Data Bus_1 to Data Bus_3 (second data bus) being different in number from the first data bus and independent from the first data bus, and a page buffer 102 (data transfer unit). When a data transfer with memory cells is performed at an ECC mode (first operation mode), the page buffer 102 connects bit lines, being equal in number to the first data bus, from among a plurality of bit lines to the first data bus to transfer data. When a data transfer with memory cells is performed at a normal mode (second operation mode), the page buffer 102 connects bit lines, being equal in number to the second data bus, from among a plurality of bit lines to the second data bus to transfer data.

Also, the data transfer unit comprises a page buffer 102a that amplifies a voltage of a bit line connected to a normal memory cell and latches the amplified result, a page buffer 102b that is replaced together with a normal memory cell and a bit line when the normal memory cell or the bit line connected to the first page buffer is defective, and a page buffer 102c that amplifies a voltage of a bit line connected to a parity memory cell and latches the amplified result. Also, the second data bus is connected to the first and second page buffers 102a and 102b, and the first data bus is connected to the first to third page buffers 102a to 102c.

Also, the semiconductor memory device comprises a page buffer 102d that is connected to the first data bus and is replaced together with a parity memory cell and a bit line when the parity memory cell or the bit line connected to the page buffer 102 is defective, a column repair circuit 104 (first repair circuit) that is connected to the second bus and replaces a page buffer, connected to a defective memory cell or bit line, from among the page buffer 102a with the page buffer 102b, a parity column repair circuit 105 (second repair circuit) that is connected to the first data bus and replaces a page buffer, connected to a defective memory cell or bit line, from among the page buffer 102c with the page buffer 102d, and an ECC circuit 107 that is connected to the first data bus and corrects an error of output data of the page buffers 102a and 102b based on output data of the page buffers 102c and 102d.

Also, the semiconductor memory device comprises a PB control circuit 60 (page buffer control circuit) that sets an output of a page buffer, connected to a defective memory cell or bit line, from among the page buffer 102a, to fixed data.

Also, when a memory cell or a bit line is defective, the page buffer control circuit does not allow writing from the first data bus.

Also, during the first operation mode, it is viewed as input data of the ECC circuit without a repair of a page buffer, corresponding to a defective memory cell or bit line, from among the page buffer 102a and the page buffer 102b that exist to perform a repair at the first operation mode and the second operation mode, respectively.

Also, If the number of bit lines is n (n being a common multiple of p and q being a natural number, p>q), the first data bus is q, and the second data bus is q. If (n/p) address signals are received at the first operation mode, the data transfer unit connects p bit lines to "p" lines of the first data bus. If (n/q) address signals are received at the second operation mode, the data transfer unit connects q bit lines to the second data bus. Although the number n of physical bit lines is not a common multiple of p and q, the rest may be used as dummy bit lines.

With the inventive concepts, since it is easy to widen a bus width of the ECC bus (first data bus) to the ECC circuit 107 (in this embodiment, a bus to the ECC circuit being a 300-bit-wide bus), also, a repair circuit (column repair circuit 104) of a main data unit is unnecessary on the ECC bus. For this reason, it is possible to implement a high-speed data transfer at ECC processing. Also, since the size of a repair circuit of the main data unit is not increased unlike a conventional technique, an increase in a chip size is suppressed and a cost corresponding to fabrication is lowered.

Also, in exemplary embodiments, there is described an embodiment where there is used a PCR repair system (parity column repair circuit 105) dedicated to a parity unit having a size smaller than a repair circuit of the main data unit. However, the inventive concepts are not limited thereto. Only, the parity column repair circuit 105 is useful to repair a defect of the parity unit. In the event that the parity column repair circuit 105 is not used, the error correction capacity is damaged. The reason is that an error is corrected by probability of 50% (0 or 1) per bit of column. In this behalf, as described above, the ECC correction capacity is improved by repairing a defect of the parity unit using the parity column repair circuit 105.

In a configuration of the NAND flash memory 10, PB_PCR102*d* (page buffer 102*d*) being a dedicated repair unit is required to repair a defect of a parity unit, thereby causing an increase in a chip size, an increase in a fabrication cost, and an increase in complexity of a system as an ECC system. For this reason, it may be considered to integrate a function of the page buffer 102*d* in the PB_CR102*b* (page buffer 102*b*).

Figure 10:
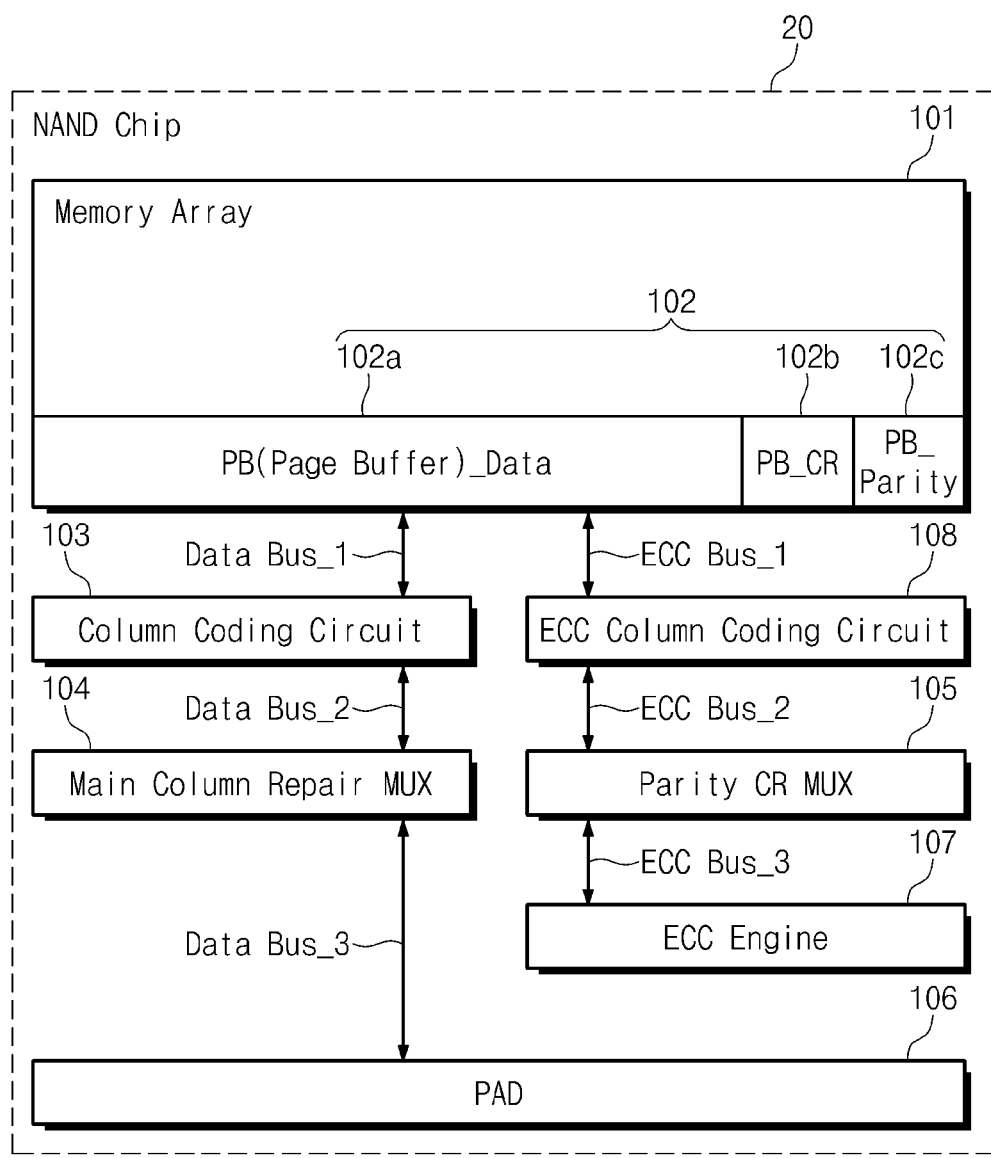
FIG. 10 is a diagram schematically illustrating a block configuration of a NAND flash memory.

FIG. 10 is a diagram schematically illustrating a block configuration of a NAND flash memory 20. In FIG. 10, components that are identical to those illustrated in FIG. 1 are marked by the same reference numerals, and a description thereof is thus omitted. The NAND flash memory 20 is different from that illustrated in FIG. 1 in that a page buffer 102*d* is eliminated. If one of page buffer units constituting a page buffer 102*c* is defective, it is replaced with one of page buffer units of a page buffer 102*b*.

The NAND flash memory 20 is configured such that the page buffer 102*b* includes a function of the page buffer 102*d* of the NAND flash memory 10. This structure of the NAND flash memory 20, however, makes it difficult to obtain consistency on an ECC code. There will be described an operation (operation 1) causing such a problem. Then, a configuration and an operation (operation 2) associated with a page buffer unit configured to solve the problem will be described. Operation 1 and operation 2 will be described using flow charts illustrated in FIGS. 9A-9D, and a difference between NAND flash memories 10 and 20 will be described.

Figure 11A:
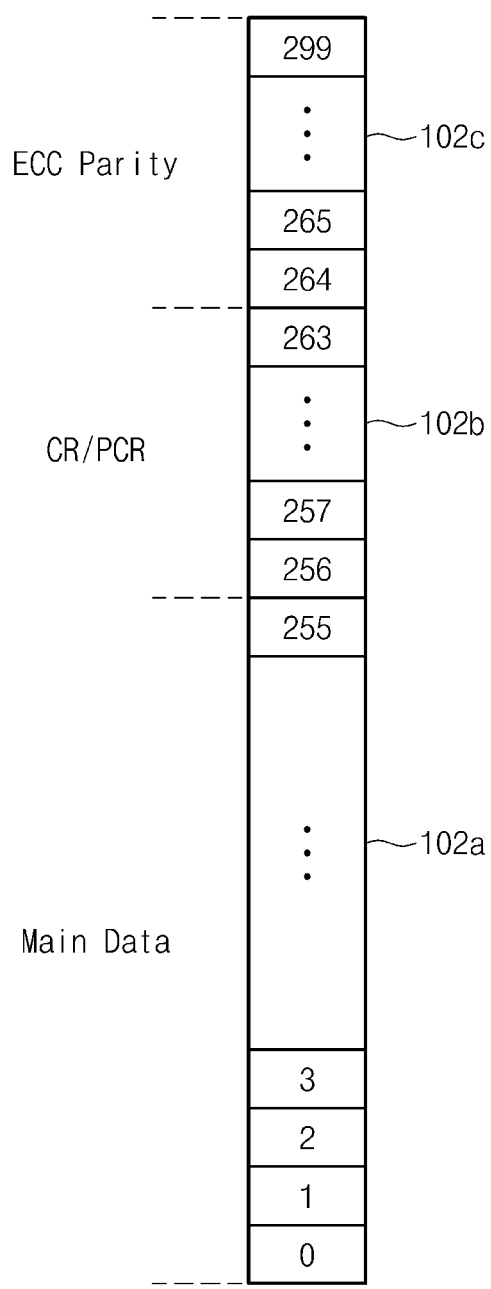
FIGS. 11A-11C are diagrams illustrating each page buffer of a page buffer of a NAND flash memory.
Figure 11B:
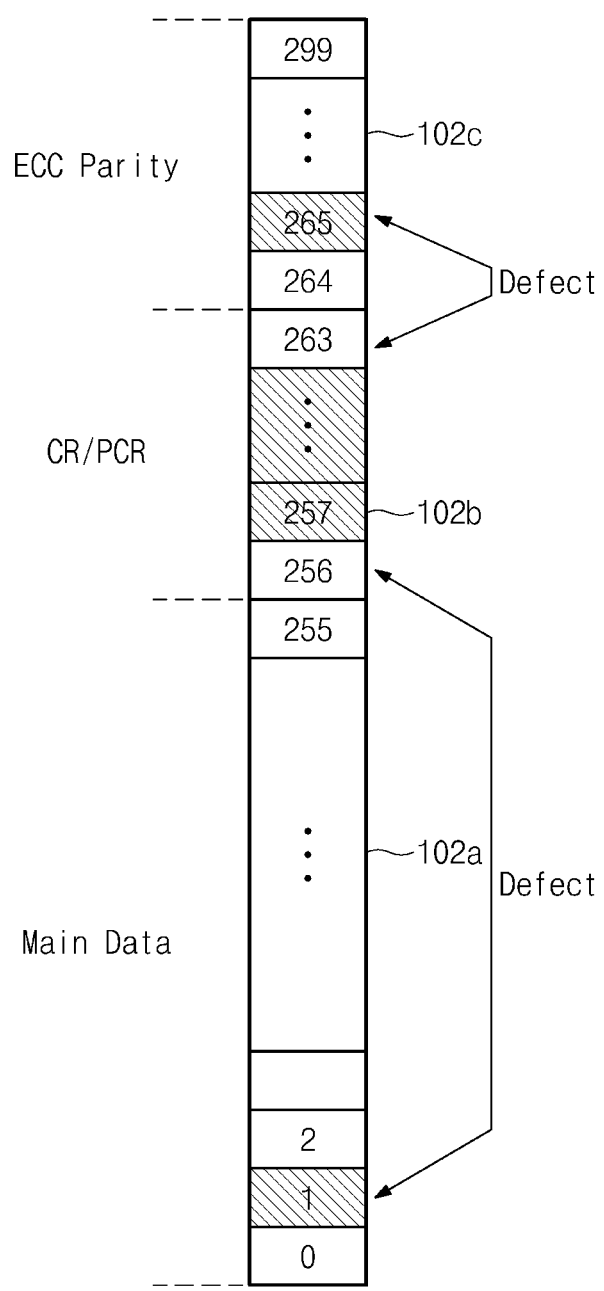
Figure 11C:
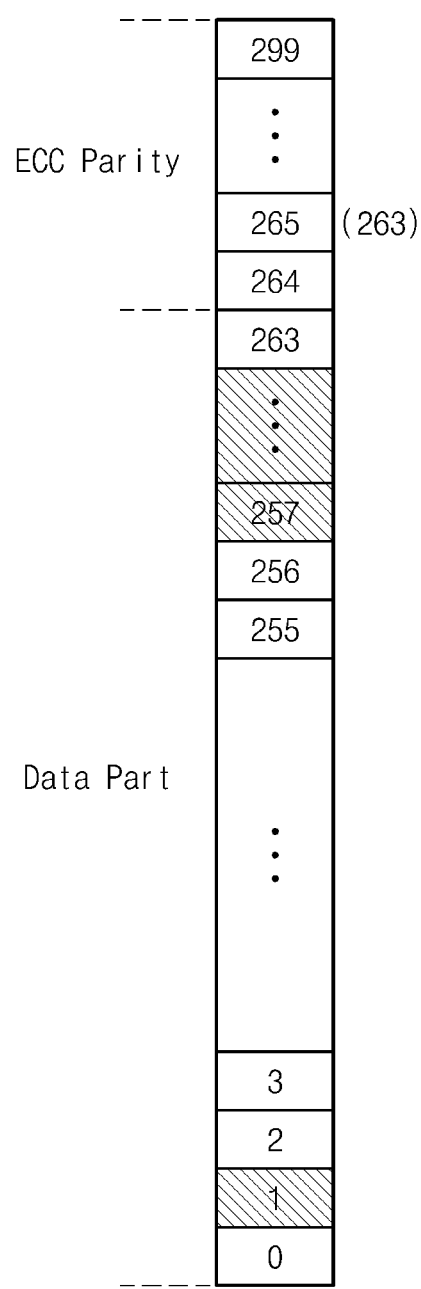

FIGS. 11A through 11C are a diagrams illustrating each page buffer constituting a page buffer 102 of a NAND flash memory 20.

In FIG. 11A, there are schematically illustrated a page buffer 120*a* corresponding to main data (normal data), a page buffer 102*b* corresponding to CR/PCR (repair data of normal data and repair data of parity data), and a page buffer 102*c* corresponding to ECC parity (parity data). In FIG. 11A, numbers indicate PB units (unit formed of PB control circuit 60 and bit inner circuits 50_0 to 50_7 illustrated in FIGS. 4 and 5) constituting the page buffers 102*a* to 102*c*. The numbers are numbers of selection signals Sel_A indicating locations of PB units, that is, Coding in FIG. 3B that illustrates an internal configuration of a PB unit).

That is, the page buffer 102*a* includes 256 PB units 0 to 255 corresponding to normal data, the page buffer 102*b* includes 8 PB units 256 to 263 to perform repair of normal data and parity data, and the page buffer 102*c* includes 36 PB units 264 to 299 corresponding to parity data.

In FIG. 11B, there is illustrated an example in which when eight bit lines connected to a PB unit 1 of the page buffer 102*a* or memory cell transistors connected to eight bit lines are defective, the PB unit 1 of the page buffer 102*a* is replaced with a PB unit 265 of the page buffer 102*b*. Also, in FIG. 11B, there is illustrated an example in which when eight bit lines connected to a PB unit 265 of the page buffer 102*c* or memory cell transistors connected to eight bit lines are defective, the PB unit 265 of the page buffer 102*c* is replaced with a PB unit 263 of the page buffer 102*b*.

PB units 257 to 262 of the page buffer 102*b* corresponding to a slashed portion in FIG. 11B are unused PB units, so they are not selected by a column coding circuit 103 under a control of a column repair circuit 104. That is, the PB units 257 to 262 may be at an inactive state.

At a normal mode, since the PB unit 1 of the page buffer 102*a* is not selected and the PB unit 256 replaced is selected by a selection signal Sel_A, a data-out signal Data_Out_A (data read from the PB unit 1) is output to an I/O pad 106 through Data Bus_1, Data Bus_2, and Data Bus_3 (second data bus). If write data is received from the I/O pad 106 at the normal mode, it is provided to the PB unit 256 through Data Bus_3, Data Bus_2, and Data Bus_1 as a data-in signal Data_A_In (data to be stored in the PB unit 1). As described above, a region of a page buffer where a user may provide a column address is from the PB unit 0 to the PB unit 255. That is, the PB unit 256 to 263 of the page buffer 102*b* and the PB units 264 to 299 of the page buffer 102*c* form a page buffer region that is inaccessible by a user.

Also, as the PB unit 1 of the page buffer 102*a* is selected by a selection signal Sel_B at an ECC mode, a data-out signal Data_Out_B fixed to a low level or a high level is transferred to an ECC circuit 107 through ECC Bus_1 and ECC Bus_2 (first data bus) so as to be used for ECC processing. Also, since the repaired PB unit 256 is selected by the selection signal Sel_B, the data-out signal Data_Out_B is transferred to the ECC circuit 107 through ECC Bus_1, ECC Bus_2, and ECC Bus_3 so as to be used to perform ECC processing as read data of the PB unit 1 seen from the user.

At the ECC mode, if the ECC processing is ended, data to be written back at the PB unit 1 is provided to the PB unit 256 through ECC Bus_3, ECC Bus_2, and ECC Bus_1 (first data bus) as a data-in signal Data_A_In. In addition, data, corresponding to PB units 0 to 255, from among ECC-processed data may be provided to the external device as clear data through a data bus Data_A (read-out).

When the PB unit 265 of the page buffer 102*c* is selected by the selection signal Sel_B at the ECC mode, a data-out signal Data_Out_B fixed to a low level or a high level is transferred to a parity column repair circuit 105 through ECC Bus_1 and ECC Bus_2 (data bus Data_B). Also, if the repaired PB unit 263 is selected by the selection signal Sel_B, a data-out signal Data_Out_B is transferred to the parity column repair circuit 105 through ECC Bus_1 and ECC Bus_2 corresponding to repair processing. Therefore, output data of the PU unit 263 is sent to the ECC circuit 107 via ECC Bus_3 as read data of the PB unit 265, so as to be used corresponding to ECC processing.

At the ECC mode, if the ECC processing is ended, data to be written back at the PB unit 265 is provided to the parity column repair circuit 105 through ECC Bus_3 corresponding to repair processing, and resultant data is then provided to the PB unit 263 through ECC Bus_2 and ECC Bus_1 (first data bus) as a data-in signal Data_B_In. In addition, ECC-processed data is not output to the external device through the data bus Data_A as described above.

(Operation 1)

A data write operation and a data read operation on a memory cell transistor will be described with reference to flow charts illustrated in FIGS. 9A-9D.

[Data Write of Operation 1]

In step ST1, a user provides a NAND flash memory 10 with a predetermined command (write command), an address (here, column address selecting a PB unit 1), and write data through an I/O pad 106. In step ST2, a repair of normal data is executed. In detail, a column coding circuit 103 selects a PB unit 256 instead of a PB unit 1 under a control of a column repair circuit 104 such that the write data is stored in the PB unit 256 (ST3).

After a time elapses, the method proceeds step ST6 when a mode is a normal mode (second operation mode) where the user invokes a program execution command (ST15). In step ST6, programming is executed such that data is transferred to a memory cell transistor from a page buffer through a bit line. In case of an ECC mode (first operation mode), the method proceeds to step ST5 to execute an ECC encoding operation as follows.

Here, FIG. 11C illustrates a code structure at ECC processing. As ECC, a data unit is data stored in PB units 0 to 263, and a parity unit (ECC parity) is data stored in PB units 264 to 299. The PB unit 263 is set to an initial value (H level) because user data is not received from an I/O pad 106 via Data Bus. Data to be written in the PB unit 1 is stored in the PB unit 256, and data stored in memory cell transistors are read and stored in PB units 0 and 2 to 255 through bit lines connected thereto.

In step ST31, data stored in the PB units 0 to 263 is provided to an ECC circuit 107 through ECC Bus_1, ECC Bus_2, and ECC Bus_3 (first data bus) (Data Load).

At this time, fixed data (L data in case of a PB control circuit 60 illustrated in FIG. 4 or H data in case of a PB control circuit 60 illustrated in FIG. 5) is provided from the PB unit 1 to the ECC circuit 107 as described above. Data that is data to be written in the PB unit 1 but data actually written in the PB unit 256 is provided to the ECC circuit 107 from the PB unit 256. Also, an initial value (H level) is provided from the PB unit 263 to the ECC circuit 107.

The ECC circuit 107 generates parity data through an encoding operation (ST32).

The ECC circuit 107 stores ECC-processed data in the PB units 0 to 299 (ST33).

At this time, an ECC coding circuit 108 selects a PB unit 300 instead of a PB unit 265 under a control of a column repair circuit 105. By this, parity data to be written back in the PB unit 265 is stored in the PB unit 300. In exemplary embodiments, it is assumed that parity data written back at the PB unit 263 is Low.

At encoding, data is not written back to the PB units 0 to 263. However, the same data may be written back. However, since parity data written at the PB unit 265 is written back at the PB unit 263, collision occurs. In exemplary embodiments, writing-back of data is not performed.

Parity data is written at PB units 264 to 299. In FIG. 11B, a write operation on a page buffer having an inactive state is inhibited by a circuit illustrated in FIG. 4 or 5.

Since data Data_i to be written at a memory cell is latched by a latch unit of each PB unit (refer to FIG. 6), a memory cell transistor is programmed (ST6). Data is iteratively provided to a memory cell from a latch unit of each PB unit until a program operation is passed (ST7). If the program operation is passed, the iterative process is ended (ST7—Yes). If the program operation is not passed, the procedure goes to step ST6 to perform a program operation until the program operation is passed (ST7—No).

[Data Read of Operation 1]

A user provides a predetermined command (read command) and an address (column address selecting the PB unit 1) (ST11). Data of a memory cell transistor is sensed by a latch unit of each PB unit, and the sensed data is latched on a connection node N1 of a bit inner circuit illustrated in FIG. 6 (ST12). Data_i is latched by the latch unit of the bit inner circuit (ST13). In case of a normal mode (second operation mode), the procedure goes to step ST15 to end a sensing operation. In case of an ECC mode (first operation mode), the procedure goes to step ST14 to perform an ECC decoding operation as follows.

Data stored in PB units 0 to 299 is provided to the ECC circuit 107 through ECC Bus_1, ECC Bus_2, and ECC Bus_3 (first data bus) (ST41).

At this time, fixed data (L data in case of a PB control circuit 60 illustrated in FIG. 4 or H data in case of a PB control circuit 60 illustrated in FIG. 5) is provided from the PB unit 1 to the ECC circuit 107 as described above. Also, data that is data to be written in the PB unit 1 but data actually written in the PB unit 256 is provided to the ECC circuit 107 from the PB unit 256.

Also, parity data that has an initial value (H) when parity is generated at encoding but is to be written back at the PB unit 265 is written back at the PB unit 263. In this case, the parity data is set to Low. Also, parity data that is data to be written in the PB unit 265 but data actually written in the PB unit 263 is provided to a parity column repair circuit 105 from the PB unit 263 through ECC Bus_1 and ECC Bus_2. A result of performing a repair operation is provided to the ECC circuit 107 through ECCBus_3.

The ECC circuit 107 performs a decoding operation to correct an error of data stored in the PB units 0 to 263 based on parity data (ST42).

In step S43, the ECC circuit 107 stores ECC-processed data in the PB units 0 to 299 (Data Store).

ECC-processed data (error-corrected data) is stored in the PB units 0 to 263. Since parity data units of PB units 264 to 299 are not used by the user, ECC-processed data (error-corrected data) is not stored in the PB units 264 to 299. However, it is possible to store ECC-processed data (error-corrected data) in the PB units 264 to 299. The PB unit 263 is selected instead of the PB unit 265 under a control of the parity column repair circuit 105. By this, error-corrected parity data to be written back in the PB unit 265 is stored in the PB unit 263. A write operation on a page buffer having an inactive state as a slashed portion in FIG. 11B is inhibited by a circuit illustrated in FIG. 4 or 5.

Since data Data_i to be written at a memory cell is latched by a latch unit of each PB unit illustrated in FIG. 6, a sensing operation is ended. Afterwards, a memory enters a readable state (ST15).

As a selection signal Sel_A is provided to the PB units 0 to 255, data stored therein is read through Data Bus_1, Data Bus_2, and Data Bus_3. At this time, a column coding circuit 103 selects the PB unit 256 instead of the PB unit 1 under a control of the column repair circuit 104. The PB unit 256 outputs data that is data to be written at the PB unit 1 but data actually written at the PB unit 256. That is, a defect column is repaired (ST16).

As described above, write data written at memory cell transistors through the PB unit 1 according to a user's request is written at other memory cells after repairing. Also, an error of the written data is corrected, and the error-corrected data is output from the I/O pad 106 (ST17).

A problem occurring when decoding of operation 1 is performed is that data provided to the ECC circuit 107 from the PB unit 263 is originally High but is changed into Low due to a repair of parity data. In this case, the ECC circuit 107 determines the data thus changed as an error bit. Originally, PCR repair is to prevent a correction capacity from being lowered when a defective PB unit is determined as an error bit by the ECC circuit 107 and is corrected. However, since a data unit of the PB unit 263 is determined to be an error bit, a merit of the PCR repair is damaged.

As described with reference to operation 1, the NAND flash memory 20 is configured such that a defective bit line of a parity unit (corresponding to page buffer 102c) of ECC is replaced with a main CR unit (corresponding to page buffer 102b) assigned as a data unit of ECC. Also, to solve a problem described with reference to operation 1, the NAND flash memory 20 is configured to select whether to assign a PB unit (corresponding to page buffer 102b) in an ECC code as a data unit of ECC or as a repairing place of a defective bit line of a parity unit of ECC.

Figure 12:
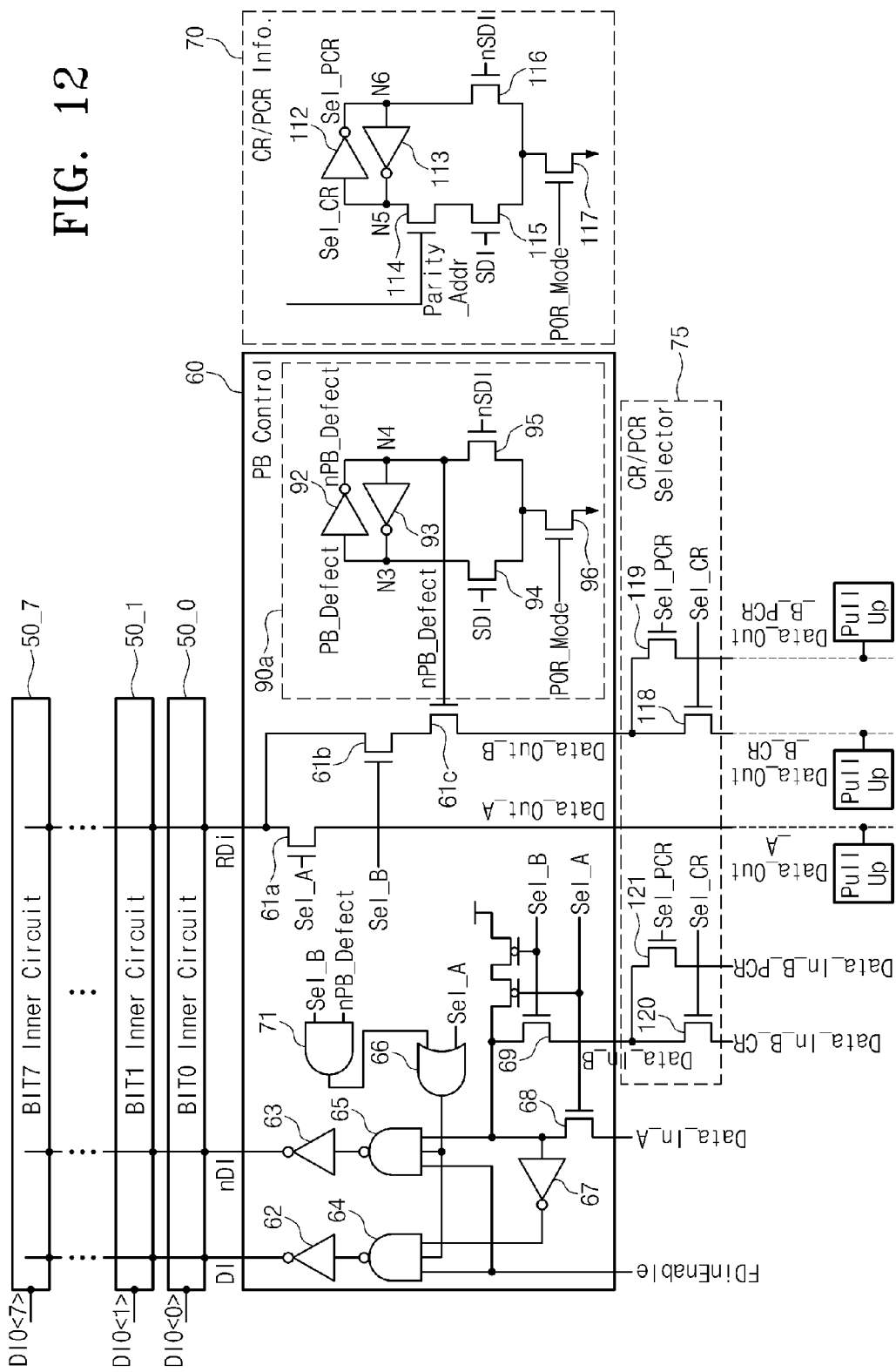
FIG. 12 is a diagram schematically illustrating an internal circuit configuration of a PB unit of a page buffer.

FIG. 12 is a diagram illustrating an internal circuit configuration of a PB unit of a page buffer. In FIG. 12, components that are identical to those in FIG. 5 are marked by the same reference numerals, and a description thereof is thus omitted. A PB unit illustrated in FIG. 12 is different from that illustrated in FIG. 5 in that it further comprises a CR/PCR information storing unit 70 and a CR/PCR selector 75. The CR/PCR information storing unit 70 may store information indicating whether the PB unit is assigned for CR (to repair a PB unit of a page buffer, that is, to repair a defective bit of Main) or for PCR (to repair a PB unit of a page buffer, that is, to repair a defective bit of Parity). Also, the CR/PCR selector 75 switches connection with a read ECC data bus or a write ECC data bus, based on information stored in the CR/PCR information storing unit 70: information indicating whether the PB unit is assigned for CR or for PCR.

Here, the read ECC data bus may include a bus (hereinafter, referred to as Data_Out_B_PCR bus), used to transfer a data-out signal Data_Out_B_CR, from among ECC_Bus and a bus (hereinafter, referred to as Data_Out_B_PCR bus) to transfer a data-out signal Data_Out_B_PCR. Also, the write ECC data bus may include a bus (hereinafter, referred to as Data_In_B_CR bus), used to transfer a data-in signal Data_In_B_CR, from among ECC_Bus and a bus (hereinafter, referred to as Data_In_B_PCR bus) to transfer a data-in signal Data_In_B_PCR.

Now will be described a circuit configuration of the CR/PCR information storing unit 70 and a data latch operation when a power is supplied to the CR/PCR information storing unit 70, with reference to FIG. 12. Here, the data latch operation is exemplary. As an example, there will be described an operation in which defect information associated with a selection signal is stored in a system storage area of a NAND flash memory 20 and is transferred to a latch corresponding to a defect information storing unit 90a and the CR/PCR information storing unit 70. Since a circuit configuration of the defect information storing unit 90a is described with reference to FIGS. 4 and 5, its description is omitted.

In case a bit line is defective and in case a bit line is not defective, an operation of the defect information storing unit 90a is substantially the same as that described with reference to PB units 0 to 255 (page buffer 102a) and PB units 264 to 299 (page buffer 102c).

Meanwhile, the PB units 256 to 263 (page buffer 102b) may have a type illustrated in FIG. 12. As a repair unit of a defective bit line, basically, the PB units are described as being defect-free. However, such PB units may be defective. In this case, if a defect is detected at a wafer test operation after fabrication, it is treated as a defective bit. Meanwhile, they are not used to repair the page buffer 102a and the page buffer 102c.

The CR/PCR information storing unit 70 includes inverter circuits 112, and 113 and transistors 114, 115, 116, and 117. Here, the transistors 114 to 117 may be an NMOS transistor.

A latch unit of the CR/PCR information storing unit 70 is formed of the inverter circuits 112 and 113. Here, an output terminal of the inverter circuit 112 and an input terminal of the inverter circuit 113 are connected to a connection node N6, and an input terminal of the inverter circuit 112 and an output terminal of the inverter circuit 113 are connected to a connection node N5.

Data that the latch unit stores may appear on the connection node N5 as a switch signal Sel_CR to switch the read ECC data bus into the Data_Out_B_CR bus. Also, data that the latch unit stores may appear on the connection node N6 as a switch signal Sel_PCR to switch the read ECC data bus into the Data_Out_B_PCR bus.

A sensing unit of the CR/PCR information storing unit 70 is formed of the transistors 114 to 117.

The transistor 114 has a drain connected to the connection node N5, a gate connected to receive a parity address signal Parity_Addr (signal having a high level when an address corresponding to a defect exists within a Parity area), and a source connected to the transistor 115.

The transistor 115 has a drain connected to a source of the transistor 114, a gate connected to receive a defect information signal SDI, and a source connected to a drain of the transistor 117.

The transistor 116 has a drain connected to the connection node N6, a gate connected to receive a defect information signal nSDI, and a source connected to the drain of the transistor 117.

A drain of the transistor 117 is connected to the source of the transistor 115 and the source of the transistor 116, a gate thereof is connected to receive a power-on reset signal POR_Mode, and a source thereof is grounded.

Here, the detect information signals SDI and the nSDI may be used to indicate whether a bit line connected to the PB control circuit 60 or a memory cell transistor connected to the bit line is defective. The defect information signal SDI and the defect information signal nSDI are set to a low level (data 0) and a high level (data 1) if a test result indicates that a bit line connected to the PB control circuit 60 is defective. The defect information signal SDI and the defect information signal nSDI are set to a high level and a low level if a test result indicates that a bit line connected to the PB control circuit 60 is not defective.

Such defect information signals may be associated with a selection signal indicating a location of the PB control circuit 60 and is stored in a system storage area of a NAND flash memory 20, for example. Also, the power-on reset signal POR_Mode may be a signal that maintains a high level during a predetermined time (time when the defect information signal is transferred to the PB control circuit 60 from the system storage area) after the NAND flash memory 20 is powered on.

With the above configuration, where a bit line connected to the PB control circuit 60 is defective, the power-on reset signal POR_Mode and the parity address signal Parity_Addr are set to a high level when a power is supplied to the NAND flash memory 20. At this time, in the defect information storing unit 90a and the CR/PCR information storing unit 70, the transistor 94 and one of the transistors 115 and 116 are turned off and the transistor 95 and the other of the transistors 115 and 116 are turned on. Since the node N3 and one of the nodes N5 and N6 are set to a high level and the node N4 and the other thereof are set to a low level, the defect signal PB_Defcet and one of switch signals Sel_CR and Sele_PCR have a high level. After a transfer period is ended, the power-on reset signal POR_Mode is set to a low level. While a power is supplied to the NAND flash memory 20, the defect signal PB_Defcet and one of the switch signals Sel_CR and Sele_PCR maintain a high level. That is, as described with reference to FIGS. 4 and 5, a transfer of a data-in signal Data_In_B from ECC Bus is inhibited by the selection signal Sel_B regardless of latch data of the CR/PCR information storing unit 70, such that a fixed value H is outputted to ECC Bus with respect to a read operation of a data-out signal Data_Out_B_CR.

Where a bit line connected to the PB control circuit 60 is not defective, the power-on reset signal POR_Mode is set to a high level when the NAND flash memory 20 is powered up. At this time, a transistor 94 is turned on, and a transistor 95 is turned off. As the node N3 is set to a low level and the node N4 is set to a high level, the defect signal PB_Defcet transitions to a low level.

After a transfer period is ended, the power-on reset signal POR_Mode is set to a low level. The defect signal PB_Defcet maintains a low level while a power is supplied to the NAND flash memory 20.

In the CR/PCR information storing unit 70, an initial value on a latch operation after power-up is set such that the node N5 (switch signal Sel_CR) has a high level. Since the power-on reset signal POR_Mode is set to a high level, the transistor 115 is turned on and the transistor 116 is turned off. In this case, if the parity address signal Parity_Addr has a high level (high level when a defect bit address of a repair source of a PB unit (CR/PCR unit) exists within a Parity area), the node N5 (switch signal Sel_CR) is set to a low level and the node N6 (switch signal Sel_PCR) is set to a high level. Meanwhile, if the parity address signal Parity_Addr has a low level (low level when a defect bit address of a repair source does not exist within a Parity area), the node N5 (switch signal Sel_CR) is set to a high level and the node N6 (switch signal Sel_PCR) is set to a low level. Referring to the defect information storing unit 90*a*, after a transfer period is ended, the power-on reset signal POR_Mode is set to a low level. In this case, the defect signal PB_Defcet retains a low level while a power is supplied to the NAND flash memory 10. As described above, the CR/PCR information storing unit 70 operates such that the switch signal Sel_CR is set to a high level when a PB unit is set as a PB unit for CR and such that the switch signal Sel_PCR is set to a high level when a PB unit is set as a PB unit for PCR.

A CR/PCR selector 75 has the following circuit configuration. The CR/PCR selector 75 includes transistors 118, 119, 120, and 121. The transistors 118, 119, 120, and 121 may be an NMOS transistor.

In the transistor 118, a drain is connected to a source of a transistor 61*c*, a gate is connected to receive the switch signal Sel_CR, and a source is connected to Data_Out_B_CR bus (line to transfer a data-out signal Data_Out_B_CR).

The transistor 119 has a drain connected to the source 61*c*, a gate connected to receive the switch signal Sel_PCR, and a source connected to Data_Out_B_PCR bus (line to transfer a data-out signal Data_Out_B_PCR).

In case of a PB unit illustrated in FIG. 5, a source of the transistor 61*c* is connected to ECC Bus (first data bus), and a pull-up circuit is connected to ECC Bus. On ECC Bus (referred to as Data_Out_B bus) is read a data-out signal Data_Out_B from the PB unit at a read operation of the first operation mode. In FIG. 12, there is illustrated an example where the data-out signal Data_Out_B is read out on the source of transistor 61*c*. Also, pull-up circuits are connected to the Data_Out_B_CR bus and the Data_Out_B_PCR bus.

The transistor 120 has a drain connected to a source (second input terminal of a switch 69 in FIG. 5) of a transistor 69, a gate connected to receive a switch signal Sel_CR, and a source connected to the Data_In_B_CR bus (line to transfer a data-in signal Data_In_B_CR).

The transistor 121 has a drain connected to the source of the transistor 69, a gate connected to receive a switch signal Sel_PCR, and a source connected to the Data_In_B_PCR bus (line to transfer a data-in signal Data_In_B_PCR).

In case of a PB unit illustrated in FIG. 5, the second input terminal of the switch 69 is connected to ECC Bus (first data bus). At a write operation of the first operation mode, a data-in signal Data_In_B is written at the source of the transistor 69 from ECC Bus (hereinafter, referred to as Data_In_B bus). In FIG. 12, there is illustrated an example where a data-in signal Data_In_B is written at the source of the transistor 69.

The CR/PCR information storing unit 70 and the CR/PCR selector 75 may be illustrated as being added to a PB unit illustrated in FIG. 5. However, the inventive concept is not limited thereto. For example, the CR/PCR information storing unit 70 and the CR/PCR selector 75 may be added to a PB unit illustrated in FIG. 4. It is unnecessary to dispose the CR/PCR information storing unit 70 and the CR/PCR selector 75 in a PB unit. For example, the CR/PCR information storing unit 70 and the CR/PCR selector 75 may be disposed as being independent from the PB unit. The CR/PCR information storing unit 70 may be implemented with other equivalent logical circuit, for example, a flip-flip.

Now will be described a circuit operation of the PB unit with the above-described configuration. Also, a circuit operation of a second operation mode (Data Bus selected by a selection signal Sel_A) is described with reference to FIGS. 4 and 5, and a description thereof is thus omitted. Here, a circuit operation of a first operation mode (ECC Bus selected by a selection signal Sel_B) will be described, but an operation of reading a data-out signal Data_Out_B or writing a data-in signal Data_In_B is not described.

(Circuit Operation of Pb Unit in FIG. 12)

(1) DATA READ (PB Activated)

A read data (read signal RD) sensed from a memory cell is provided on a line of a data-out signalData_Out_B. Since a switch signal Sel_CR is set to a high level when a PB unit is for CR, the read signal RD is output on the Data_Out_B_CR bus as a data-out signal Data_Out_B_CR.

Meanwhile, a fixed value H is output on the Data_Out_B_PCR bus via the pull-up circuit.

In contrast, as a switch signal Sel_PCR is set to a high level when a PB unit is for PCR, the read signal RD is output as Data_Out_B_PCR. Meanwhile, a fixed value H is output on the Data_Out_B_CR bus via the pull-up circuit.

(2) DATA WRITE (PB Activated)

Because the switch signal Sel_PCR is set to a high level when the PB unit is for CR, a data-in signal Data_In_B_CR from the Data_In_B_CR bus is written on a line of a data-in signal Data_In_B illustrated in FIG. 12.

In contrast, the switch signal Sel_PCR is set to a high level when the PB unit is for CR; therefore, a data-in signal Data_In_B_PCR from the Data_In_B_PCR bus is written on a line of a data-in signal Data_In_B illustrated in FIG. 12.

(3) DATA READ (PB Inactivated)

A transistor 61*c* is turned off in response to a low level of a defect signal nPB_Defect. At this time, a fixed value H is output on Data_Out_B_CR bus and Data_Out_B_PCR bus regardless of whether the PB unit is assigned for CR or for PCR.

(4) DATA WRITE (PB Inactivated)

As described with reference to FIGS. 4 and 5, no signal is written on a line of the data-in signal Data_In_B regardless of whether the PB unit is assigned for CR or for PCR.

Now will be described an operation (operation 2) of an embodiment in which a configuration of a page buffer unit is changed.

In operation, like a description on operation 1, a code structure at ECC processing illustrated in FIG. 11C is used. Also, a PB unit illustrated in FIG. 5 is disposed with respect to PB units 256 to 263 of a page buffer 102b. In addition, PB units 0 to 255 (Main Data unit) and PB units 264 to 299 (Parity unit) of a page buffer 102a may use a PB unit illustrated in FIGS. 4 and 5.

Figure 13:
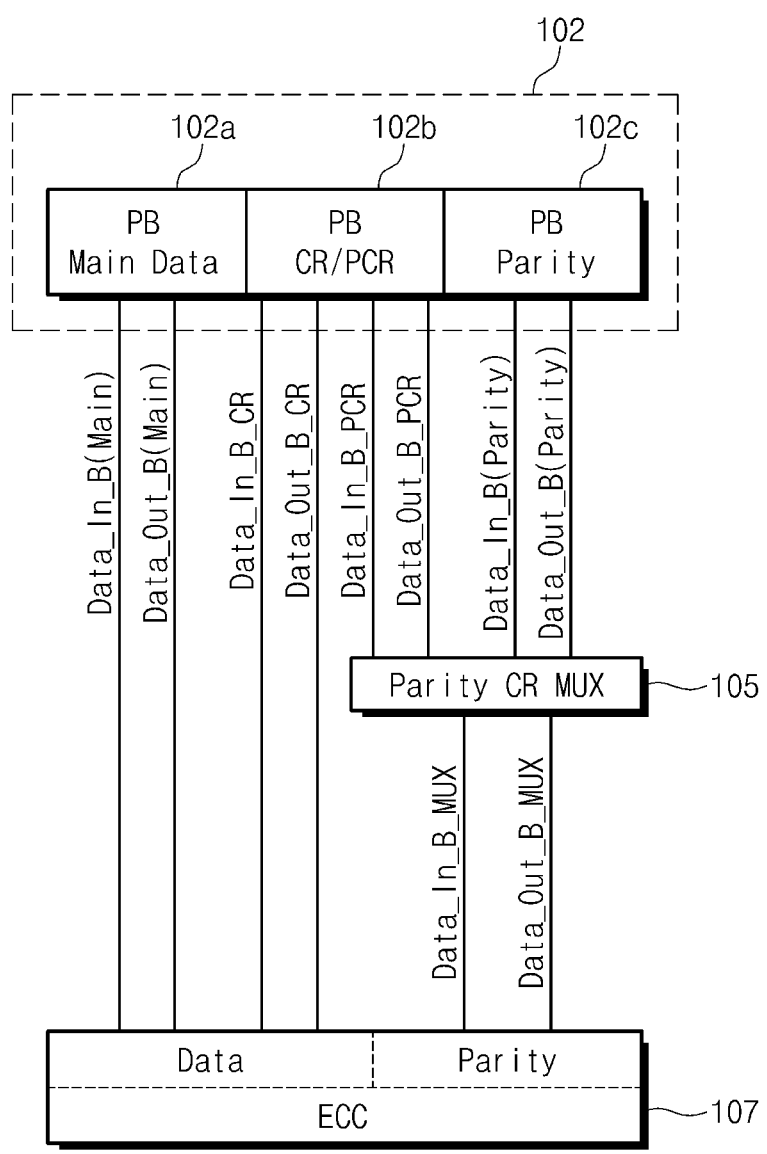
FIG. 13 is a diagram illustrating a first mode of operation of a portion corresponding to a page buffer, a parity column repair circuit, and an ECC circuit.

FIG. 13 is a diagram illustrating an operation of a first operation mode on a portion corresponding to a page buffer 102, a parity column repair circuit 105, and an ECC circuit 107.

FIG. 13 illustrates an example in which a first operation mode and a portion corresponding to the page buffer 102, the parity column repair circuit 105, and the ECC circuit 107 of a NAND flash memory 20 illustrated in FIG. 10 are modified to describe the following operation 2.

In FIG. 13, a column coding unit 108 is omitted. 264 PB units of a page buffer 102a (PB units 0 to 255 corresponding to Main Data) and a page buffer 102b (PB units 256 to 263 corresponding to PB CR/PCR) correspond to data units 0 to 263 of an ECC circuit 107 via ECC Bus, respectively.

A first portion of ECC Bus corresponding to the PB units 0 to 255 is referred to as Data_In_B(Main) bus, and a second portion of ECC Bus corresponding to the data units 0 to 255 of the ECC circuit 107 is referred to as Data_Out_B(Main) bus. The Data_In_B(Main) bus is used to transfer a data-in signal Data_In_B(Main), and the Data_Out_B(Main) bus is used to transfer a data-out signal Data_Out_B(Main).

ECC Bus corresponding to the PB units 256 to 263 and ECC Bus corresponding to the data units 256 to 263 of the ECC circuit 107 are referred to as Data_In_B_CR bus and Data_Out_B_CR bus, respectively. The Data_In_B_CR bus is used to transmit a data-in signal Data_In_B_CR, and the Data_Out_B_CR bus is used to transmit a data-out signal Data_Out_B_CR.

It is assumed that 36 PB units 264 to 299 for parity correspond to parity units 264 to 299 of the ECC circuit 107, respectively. That is, ECC Bus (ECC Bus_1 and ECC Bus_2 in FIG. 10) corresponding to PB units 264 to 299 for parity and the parity column repair circuit 105 is referred to as Data_In_B(Parity) bus and Data_Out_B(Parity) bus. ECC Bus (ECC Bus_3 in FIG. 10) corresponding to the parity column repair circuit 105 and parity units 264 to 299 of the ECC circuit 107 is referred to as Data_In_B_MUX bus and Data_Out_B_MUX bus. The Data_In_B(Parity) bus and the Data_In_B_MUX bus are used to transmit a data-in signal Data_In_B(Parity), and the Data_Out_B(Parity) bus and the Data_Out_B_MUX bus are used to transfer a data-out signal Data_Out_B(Parity).

Also, ECC Bus (ECC Bus_1 and ECC Bus_2 in FIG. 10) corresponding to the PB units 256 to 263 and the parity column repair circuit 105 is referred to as the Data_In_B_PCR bus and the Data_Out_B_PCR bus as described above. The Data_In_B_PCR bus is used to send a data-input signal Data_In_B_PCR, and the Data_Out_B_PCR bus is used to provide a data-out signal Data_Out_B_PCR.

That is, in the PB CR/PCR unit (PB units 256 to 263) is disposed the PB unit illustrated in FIG. 12. The Data_In_B_CR bus is connected to a data unit of the ECC circuit 107, the Data_In_B_PCR to the parity column repair circuit 105, the Data_Out_B_CR to the data unit of the ECC circuit 107, and the Data_Out_B_PCR bus to the parity column repair circuit 105.

With the above description, a page buffer 102 of a NAND flash memory 20 includes a page buffer 102a, a page buffer 102b, and a page buffer 102c.

The page buffer 102a includes 256 PB units 0 to 255 as PB units corresponding to normal data illustrated in FIG. 4 or 5. The page buffer 102b is used to repair normal data or parity data and has 8 PB units 256 to 263 as the CR/PCR PB units illustrated in FIG. 12. The page buffer 102c has 36 PB units 264 to 299 as PB units corresponding to parity data.

As illustrated in FIG. 11B, there is illustrated an example where a PB unit 1 of the page buffer 102a is replaced with a PB unit 256 of the page buffer 102b when eight bit lines connected to the PB unit 1 of the page buffer 102a or memory cell transistors connected to the eight bit lines are defective. At this time, in an CR/PCR information storing unit 70 of the PB unit 256 is stored latch data by which a switch signal Sel_CR is set to a high level (latch data is stored using a power-up sequence).

In FIG. 11B, there is illustrated an example where a PB unit 265 of the page buffer 102c is replaced with a PB unit 263 of the page buffer 102b when eight bit lines connected to the PB unit 26 of the page buffer 102c or memory cell transistors connected to the eight bit lines are defective. At this time, since the PB unit 263 is a repairing place of PCR, latch data by which a switch signal Sel_PCR is set to a high level is stored in the CR/PCR information storing unit 70.

In FIG. 11B, since PB units 257 to 262 of the page buffer 102b are not used, they are not selected by a column coding circuit 103 under a control of a column repair circuit 104. That is, the PB units 257 to 262 may be at an inactive state.

Also, at a normal mode, since the PB unit 1 of the page buffer 102a is not selected and the PB unit 256 replaced is selected by a selection signal Sel_A, read data Data_Out_A (data read from the PB unit 1) is output to an I/O pad 106 through Data Bus_1, Data Bus_2, and Data Bus_3 (second data bus). If write data is received from the I/O pad 106 at the normal mode, it is provided to the PB unit 256 through Data Bus_3, Data Bus_2, and Data Bus_1 as a data-in signal Data_A_In (data to be stored in the PB unit 1). As described above, a region of a page buffer where a user may use using a column address is from the PB unit 0 to the PB unit 255. That is, the PB unit 256 to 263 of the page buffer 102b, the PB units 264 to 299 of the page buffer 102c form a page buffer region that is inaccessible by a user.

Also, since the PB unit 1 of the page buffer 102a is selected by a selection signal Sel_B at the ECC mode, and a data-out signal Data_Out_B(Main) fixed to a low level or a high level is transferred to the ECC circuit 107 through the Data_Out_B(Main) bus (ECC Bus_1, ECC Bus_2, and ECC Bus_3: first data bus) so as to be used to perform ECC processing.

Also, since the repaired PB unit 256 is selected by the selection signal Sel_B but a switch signal Sel_CR is set to a high level, a data-out signal Data_Out_B_CR is transferred up to the ECC circuit 107 through the Data_Out_B_CR bus (ECC Bus_1, ECC Bus_2, and ECC Bus_3) so as to be used to perform ECC processing as read data of the PB unit 1 seen from the user.

Also, since the repaired PB unit 263 is selected by the selection signal Sel_B but a switch signal Sel_PCR is set to a high level, a data-out signal Data_Out_B_CR being fixed data is transferred up to the ECC circuit 107 through the Data_Out_B_CR bus (ECC Bus_1, ECC Bus_2, and ECC Bus_3) so as to be used to perform ECC processing as fixed data.

At the ECC mode, if the ECC processing is ended, data to be written back at the PB unit 1 is provided to the PB unit 256 through the Data_Out_B(Main) bus (ECC Bus_3, ECC Bus_2, and ECC Bus_1: first data bus) as a data-in signal Data_B_In.

A data-in signal Data_B_In_CR is provided to the PB unit 256 via the Data_B_In_CR bus. Also, a data-in signal Data_B_In_CR is not provided to the PB unit 263 via the Data_B_In_CR bus.

In addition, data, corresponding to PB units 0 to 255, from among ECC-processed data may be provided to an external device as clear data through Data Bus.

As the PB unit 265 of the page buffer 102c is selected by the selection signal Sel_B at the ECC mode, a data-out signal Data_Out_B(Parity) fixed to a low level or a high level is transferred up to a parity column repair circuit 105 through the Data_In_B(Parity) bus ((ECC Bus_1 and ECC Bus_2: data bus Data_B).

Also, since the repaired PB unit 263 is selected by the selection signal Sel_B, a data-out signal Data_Out_B_PCR is transferred up to the parity column repair circuit 105 through the Data_Out_B_PCR bus (ECC Bus_1 and ECC Bus_2) to perform repair processing. Thus, output data of the PB unit 263 is transmitted up to the ECC circuit 107 via the Data_Out_B_MUX bus (ECC Bus_3) as a data-out signal of the PB unit 265 so as to be used to perform ECC processing.

At the ECC mode, if the ECC processing is ended, data to be written back at the PB unit 265 is provided to the parity column repair circuit 105 through the Data_In_B_MUX bus (ECC Bus_3), is repaired, and is provided to the PB unit 263 via the Data_In_B_PCR bus (ECC Bus_2 and ECC Bus_1: first data bus) as a data-in signal Data_B_In_PCR. In addition, ECC-processed data is not output to the external device through the data bus Data_A as described above.

(Operation 2)

Now will be described a data read operation (operation 2) and a data write operation on a memory cell transistor with reference to a flow chart illustrated in FIGS. 9A-9D.

(Data Write of Operation 2)

In step ST1, a user provides a NAND flash memory 10 with a predetermined command (write command), an address (indicating a column address selecting a PB unit 1), and write data through an I/O pad 106.

In step ST2, a repair of normal data is executed. In particular, a column coding circuit 103 selects a PB unit 256 instead of a PB unit 1 under a control of a column repair circuit 104; therefore, the write data is stored in the PB unit 256 (ST3).

After a time elapses and if the user invokes a program execution command, the method proceeds step ST6 when a mode is a normal mode (second operation mode). In step ST6, programming is executed such that data is transferred to a memory cell transistor from a page buffer through a bit line. In case of an ECC mode (first operation mode), the method proceeds to step ST5 to execute an ECC encoding operation as follows.

Here, FIG. 11C illustrates a code structure at ECC processing. A data unit as ECC is formed of data stored in PB units 0 to 263, and a parity unit (ECC parity) is formed of data stored in PB units 264 to 299. The PB unit 263 is set to an initial value (H level) because user data is not received from an I/O pad 106 via Data Bus. Data to be written in the PB unit 1 is stored in the PB unit 256, and data stored in memory cell transistors are read and stored in PB units 0 and 2 to 255 through bit lines connected thereto.

In step ST31, data stored in the PB units 0 to 263 is provided to an ECC circuit 107 through ECC Bus_1, ECC Bus_2, and ECC Bus_3 (first data bus).

At this time, fixed data (L data in case of a PB control circuit 60 illustrated in FIG. 4 or H data in case of a PB control circuit 60 illustrated in FIG. 5) is provided to the PB unit 1 in the ECC circuit 107. Data that is data to be written in the PB unit but data written in the PB unit 256 is provided to the PB unit 256 in the ECC circuit 107. A fixe value is provided to the ECC circuit 107 because PB units 257 to 262 are at an inactive state. In the PB unit 263, since a switch signal Sel_PCR has a high level, a fixed value is provided to the ECC circuit 107.

The ECC circuit 107 generates parity data through an encoding operation (ST32).

The ECC circuit 107 stores ECC-processed data in the PB units 0 to 299 (ST33).

At this time, an ECC coding circuit 108 selects a PB unit 263 instead of a PB unit 265 under a control of a column repair circuit 105. By this, parity data to be written back in the PB unit 265 is written back in the PB unit 263.

At encoding, data is not written back to the PB units 0 to 263. However, the same data may be written back. In this case, having an inactive state, the PB unit 1 and the PB units 257 to 262 don't experience a write-back operation. Since a switch signal Sel_PCR is at a high level, writing of a data-in signal Data_In_B_CR from ECC Bus in the PB unit 263 is not allowed. The PB unit 263 keeps parity data, so there is prevented collision with a data-in signal on ECC Bus as described with reference to operation 1.

Parity data is written at PB units 264 to 299. In FIG. 11B, there is inhibited a write operation on a page buffer having an inactive state.

Since data Data_i to be written at a memory cell is latched by a latch unit of each PB unit, a memory cell transistor is programmed (ST6).

Data is iteratively provided to a memory cell from a latch unit of each PB unit until a program operation is passed (ST7). If the program operation is passed, the iterative process is ended (ST7—Yes). If the program operation is not passed, the procedure goes to step ST6 to perform a program operation until the program operation is passed (ST7—No).

(Data Read of Operation 2)

A user provides a predetermined command (read command) and an address (column address selecting the PB unit 1) (ST11).

Data of a memory cell transistor is sensed by a latch unit of each PB unit, and the sensed data is latched on a connection node N1 of a bit inner circuit illustrated in FIG. 6 (ST12).

Data Data_i is latched by the latch unit of the bit inner circuit (ST13).

In case of a normal mode (second operation mode), the procedure goes to step ST15 to end a sensing operation. In case of an ECC mode (first operation mode), the procedure goes to step ST14 to perform an ECC decoding operation as follows.

Data stored in PB units 0 to 299 is provided to an ECC circuit 107 through ECC Bus_1, ECC Bus_2, and ECC Bus_3 (first data bus) (ST41).

At this time, fixed data (L data in case of a PB control circuit 60 illustrated in FIG. 4 or H data in case of a PB control circuit 60 illustrated in FIG. 5) is provided to the PB unit 1 from the ECC circuit 107.

Also, data that is data to be written at the PB unit 1 but data written at the PB unit 256 is provided to the PB unit 256 from the ECC circuit 107.

Since parity data that is to be written at the PB unit 265 is written back at the PB unit 263, L data is stored in the PB unit 263. The PB unit 263 is assigned as a repairing place for PCR, and a switch signal Sel_PCR goes to a high level. At this time, since a data-out signal Data_Out_B_CR has a fixed H-data value, a fixed H-data value is provided to the ECC circuit 107.

Also, a parity column repair circuit 105 receives and repairs parity data, which is data to be written at the PB unit 265 but data actually written at the PB unit 263, via the Data_Out_B_PCR bus (ECC Bus_1 and ECC Bus_2), and the repaired result is provided to the ECC circuit 107 via ECC Bus_3.

The ECC circuit 107 performs a decoding operation to correct an error of data stored in the PB units 0 to 263 based on the parity data (ST42).

The ECC circuit 107 writes ECC-processed data back at the PB units 0 to 299 (performs a data storing operation) (ST43).

ECC-processed data (error-corrected data) may be written back at the PB units 0 to 263. Since a user does not use a parity data unit of the PB units 264 to 299, it is unnecessary to write the ECC-processed data (error-corrected data). Or, ECC-processed data (error-corrected data) may be written back. Under a control of the parity column repair circuit 105, the PB unit 265 is not selected and the PB unit 263 is selected. Thus, ECC-processed parity data to be written back at the PB unit 265 is written back at the PB unit 263.

In each PB unit, data Data_i to be written at a memory cell is latched by a latch unit illustrated in FIG. 6, so that a sensing operation is ended (ST15). Then, a NAND flash memory enters a readable state.

As a selection signal Sel_A is provided to the PB units 0 to 255, data stored therein is read through Data Bus_1, Data Bus_2, and Data Bus_3. At this time, a column coding circuit 103 selects the PB unit 256 instead of the PB unit 1 under a control of the column repair circuit 104.

The PB unit 256 outputs data that is data to be written at the PB unit 1 but data actually written at the PB unit 256. That is, a defect column is repaired (Defect Column Repair) (ST16).

As described above, write data to be written at memory cell transistors through the PB unit 1 according to a user's request is written at another memory cell after repairing. Also, an error of the written data is corrected, and the error-corrected data is output from the I/O pad 106 (ST17).

With the above description, the PB units 256 to 263 may be used to repair defects of Main Data or Parity. When a data unit of ECC is assigned to repair defects of Parity, fixed data is output to the data unit of ECC. Thus, consistency on an ECC code is maintained.

A NAND flash memory 20 includes ECC Bus (first data bus) and Data Bus (second data bus). The Data Bus (second data bus) is different in number from the first data bus and is independent from the first data bus. The NAND flash memory 20 includes a page buffer 102 (data transfer unit), during a first operation mode, connects bit lines of which the number is equal to the number of lines of the first data bus, to the first data bus to transfer data. Meanwhile, the page buffer 102 (data transfer unit) connects bit lines of which the number is equal to the number of lines of the second data bus, to the second data bus to transfer data, during a second operation mode. The data transfer unit includes a page buffer 102a (first page buffer) to latch data of a normal bit line connected to a normal memory cell and a page buffer 102c (second page buffer) to latch data of a parity bit line connected to a parity memory cell. If a normal memory cell or a normal bit line connected to the first page buffer is defective, a page buffer (third page buffer) may be repaired together with the normal memory cell and the normal bit line. Or, if a parity memory cell or a parity bit line connected to the second page buffer is defective, the page buffer (third page buffer) may be repaired together with the parity memory cell and the parity bit line.

The first data bus is connected to the first to third page buffers, and the second data bus is connected to the first and third page buffers.

In case of the NAND flash memory 20, as compared with the case that a defect repair area (page buffer 102d) for Parity is provided, an increase in the size of a repair circuit and an increase in a chip size are prevented. Also, it is possible to simplify mapping of addresses to select a page buffer corresponding to redundancy and a page buffer corresponding to parity data.

In the page buffer 102b (third page buffer) is previously stored identification data indicating whether it is used to repair a first page buffer or a second page buffer. The page buffer 102b operates as the first page buffer or the second page buffer according to the identification data.

Parity data is stored in an unused PB unit of PB units 256 to 263 of the page buffer 102b: the unused PB unit belongs to an ECC Data unit and does not store valid data.

Efficiency of a defect repair is improved by setting assignment of CR/PCR, thereby reducing a cost. For example, in case a few defects exist at the Main Data unit but a lot of defects exist at the Parity unit (or vice versa), a repair is perfectly made when the number of defects is below the number of PB units to perform repair.

A PB unit illustrated in FIG. 12 has a function of exchanging CR/PCR by adding a circuit to a PB unit illustrated in FIGS. 4 and 5. It is possible to implement all PB units with the PB unit illustrated in FIG. 12, but a circuit size increases. A redundancy area is reduced by implementing the page buffer 102b (CR/PCR of PB units 256 to 263) to include the PB unit illustrated in FIG. 12.

The NAND flash memory 20 includes an ECC circuit 107 and a parity column repair circuit 105. The ECC circuit 107 is connected to the first data bus and corrects of output data of the first page buffer provided to a data input/output unit based on output data of the second page buffer provided to a parity data input/output unit. The parity column repair circuit 105 is connected to the first data bus and repairs a page buffer, associated with a defective parity memory cell or parity bit line, of the second page buffer with the third page buffer at an ECC mode.

In case the identification data (switch signal Sel_PCR) indicates a repairing place of the second page buffer, the third page buffer that is selected at a data read operation of a first operation mode outputs fixed data to a data input/output unit of the ECC circuit 107 via the Data_Out_B_CR bus (first data bus) and parity data to a parity data input/output unit of the ECC circuit 107 via the Data_Out_B_PCR bus (first data bus) and the parity column repair circuit (repair circuit) 105. Meanwhile, the third page buffer that is selected at a data write operation of the first operation mode receives parity data from the parity data input/output unit of the ECC circuit 107 without allowing a write operation of a data-in signal Data_In_CR (data) from a data input/output unit of the ECC circuit 107.

As described above, a data unit and a parity unit exist at the ECC code, but the inventive concept provides a means belonging to both the data unit and the parity unit to store parity data in a bit in which valid data is not stored. In this case, a read value of the ECC data unit is a fixed value, writing data at a bit of the data unit is inhibited, and writing and reading on the parity unit are allowing. Thus, it is possible to maintain consistency on the ECC code.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A semiconductor memory device, comprising:
a first data bus;
a second data bus being independent from the first data bus, the number of lines of the first data bus being different from that of the second data bus; and
a data transfer unit to transfer data by connecting the first data bus with bit lines, the number of which is equal to the number of lines of the first data bus, from among a plurality of bit lines when data is transferred to/from memory cells during a first operation mode and transfers data by connecting the second data bus with bit lines, the number of which is equal to the number of lines of the second data bus, from among the plurality of bit lines when data is transferred to/from memory cells during a second operation mode,
wherein the data transfer unit comprises:
a first page buffer to latch data of a normal bit line connected to a normal memory cell;
a second page buffer to latch data of a parity bit line connected to a parity memory cell; and
a third page buffer that is replaced together with a normal memory cell and a normal bit line when a normal memory cell or a normal bit line connected to the first page buffer is defective, or is replaced together with a parity memory cell and a parity bit line when a parity memory cell or a parity bit line connected to the second page buffer is defective,
wherein the first data bus is connected to the first, second, and third page buffers and the second data bus is connected to the first and third page buffers.

2. The semiconductor memory device of claim 1, wherein the third page buffer previously stores identification data indicating whether either one of the first and second page buffers is replaced and operates as the first page buffer or the second page buffer in response to the identification data.

3. The semiconductor memory device of claim 2, further comprising:
an error correction code (ECC) circuit which is connected to the first data bus and corrects an error of output data of the first page buffer input in a data input/output unit based on output data of the second page buffer input in a parity data input/output unit; and
a repair circuit that is connected to the first data bus and replaces a page buffer, connected to a defective parity memory cell or parity bit line, from among the second page buffer with the third page buffer during the first operation mode,
wherein if the identification data indicates that the second page buffer is replaced, the third page buffer outputs fixed data to a data input/output unit of the ECC circuit via the first data bus and parity data to a parity data input/output unit of the ECC circuit via the first data bus and the repair circuit when a data read operation of the first operation mode is selected, and parity data from a parity data input/output unit of the ECC circuit is input in the third page buffer without allowing an input of data from a data input/output unit of the ECC circuit, when a data write operation of the first operation mode is selected.

4. The semiconductor memory device of claim 3, wherein the first page buffer includes a page buffer control circuit configured to set an output of a page buffer, connected to a defective memory cell or bit line, to fixed data and the page buffer control circuit inhibits an input from the first data bus when a memory cell or a bit line is defective.

5. A semiconductor memory device, comprising:
a data transfer unit including a first page buffer to store normal data, a second page buffer to store parity data, and a third page buffer configured to operate as a selected page buffer unit in the first and second page buffers to act as a shared page buffer at a repair operation on a defective column; and
a repair circuit configured to repair a page buffer unit of the second page buffer, associated with a defective parity memory cell or a defective parity bit line, with a buffer unit of the third page buffer.

6. The semiconductor memory device of claim 5, further comprising:
an ECC circuit connected to a first data bus connected with the first, second, and third page buffers and configured to correct an error of output data of the first page buffer input in a data input/output unit, based on output data of the second page buffer.

7. The semiconductor memory device of claim 6, wherein in the third page buffer is previously written identification data indicating a page buffer unit of either one of the first and second page buffers is repaired.

8. The semiconductor memory device of claim 6, wherein the data transfer unit, during a first operation mode, connects first bit lines of a plurality of bit lines to the first data bus such that data is transferred, the number of the first bit lines being equal to the number of bus lines of the first data bus, and
wherein the data transfer unit, during a second operation mode, connects second bit lines of the plurality of bit lines to the second data bus such that data is transferred, the number of the second bit lines being equal to the number of bus lines of the second data bus that is independent of the first data bus.

9. The semiconductor memory device of claim 8, wherein the number of page buffer units in the third page buffer is less than that of the second page buffer.

10. The semiconductor memory device of claim 8, wherein the first page buffer includes:
a page buffer control circuit configured to set an output of a page buffer, connected to a defective memory cell or bit line, to fixed data, and
wherein the page buffer control circuit inhibits writing from the first data bus when a memory cell or a bit line is defective.

11. The semiconductor memory device of claim 10, wherein the third page buffer includes a repair information storing unit to store identification data indicating whether a page buffer unit of either one of the first and second page buffers is repaired.

12. The semiconductor memory device of claim 11, further comprising:
a column repair selecting unit configured to connect a page buffer unit of the third page buffer to a read ECC data bus or a write error correction code (ECC) data bus, based on the identification data.

13. The semiconductor memory device of claim 12, wherein if the identification data indicates repair information on the second page buffer, the third page buffer outputs fixed data to a data input/output unit of the ECC circuit via the first data bus and parity data to a parity data input/output unit of the ECC circuit via the first data bus and the repair circuit during a data read operation of the first operation mode, and receives parity data from the parity data input/output unit of the ECC circuit with writing of data from the data input/output unit of the ECC circuit not permitted during a data write operation of the first operation mode.

14. The semiconductor memory device of claim 6, wherein the second data bus is connected to the first and third page buffers.

15. The semiconductor memory device of claim 6, wherein the third page buffer is repaired together with a normal memory cell and a normal bit line when the normal memory cell or the normal bit line connected to the first page buffer is defective, and
    wherein the third page buffer is repaired together with a parity memory cell and a parity bit line when the parity memory cell or the parity bit line connected to the second page buffer is defective.

16. The semiconductor memory device of claim 5, wherein the first data bus is an error correction code (ECC) bus.

17. The semiconductor memory device of claim 16, wherein the number of buses of the second data bus is more than that of the ECC bus.

18. A semiconductor memory device, comprising:
    a data transfer unit including a first page buffer to store normal data, a second page buffer to store parity data, and a third page buffer that is replaced together with one of normal data when the stored normal data is defective and parity data when the stored parity data is defective; and
    a repair circuit configured to repair a page buffer unit of the second page buffer, associated with a defective parity memory cell or a defective parity bit line, with a buffer unit of the third page buffer.

19. The semiconductor memory device of claim 18, further comprising:
    an error correction code (ECC) circuit connected to a first data bus connected with the first, second, and third page buffers and configured to correct an error of output data of the first page buffer input in a data input/output unit, based on output data of the second page buffer.

20. The semiconductor memory device of claim 19, wherein in the third page buffer is previously written identification data indicating a page buffer unit of either one of the first and second page buffers is repaired.

* * * * *